(12) United States Patent
Itoh et al.

(10) Patent No.: US 6,429,060 B1
(45) Date of Patent: Aug. 6, 2002

(54) METHOD FOR FABRICATING SEMICONDUCTOR DEVICE

(75) Inventors: Kazuo Itoh; Hiroyuki Yamauchi, both of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/934,538

(22) Filed: Aug. 23, 2001

(30) Foreign Application Priority Data

Aug. 24, 2000 (JP) ........................................ 2000-253726

(51) Int. Cl.⁷ ............................................. H01L 21/336
(52) U.S. Cl. .................. 438/197; 438/585; 438/586; 438/622; 438/926
(58) Field of Search .................................. 438/197, 183, 438/259, 585, 586, 597, 622, 926

(56) References Cited

U.S. PATENT DOCUMENTS

| | | | |
|---|---|---|---|
| 6,043,147 A | 3/2000 | Gardner et al. | 438/692 |
| 6,300,201 B1 * | 10/2001 | Shao et al. | 438/281 |
| 6,333,223 B1 * | 12/2001 | Moriwaki et al. | 438/241 |
| 6,368,923 B1 * | 4/2002 | Huang | 438/275 |

* cited by examiner

Primary Examiner—T. N. Quach
(74) Attorney, Agent, or Firm—McDermott, Will & Emery

(57) ABSTRACT

The accuracy in forming a gate electrode or an interconnect is improved by using a dummy gate electrode or a dummy interconnect. In addition, the dummy gate electrode or the dummy interconnect is removed, so that a region where the dummy gate electrode or the dummy interconnect has been disposed can be used as a region for forming another composing element.

14 Claims, 26 Drawing Sheets

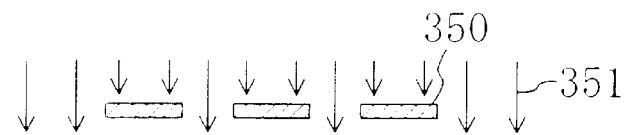
FIG. 12A
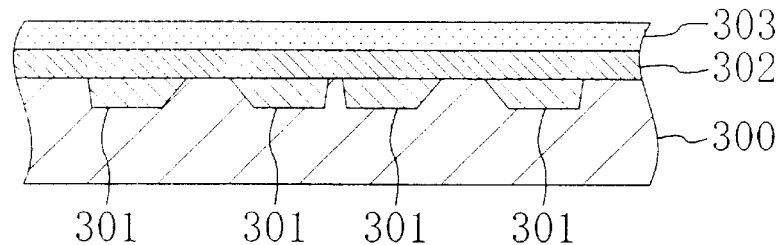
FIG. 12B
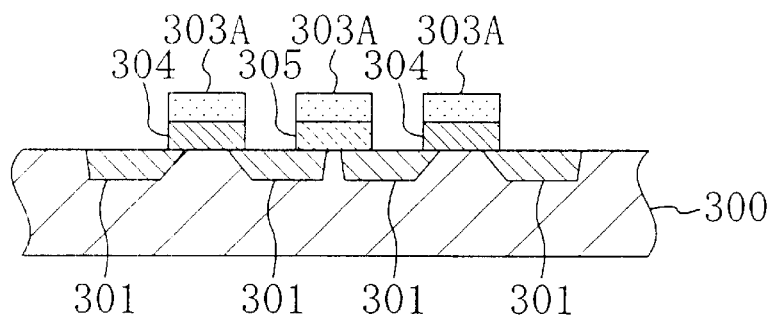
FIG. 12C
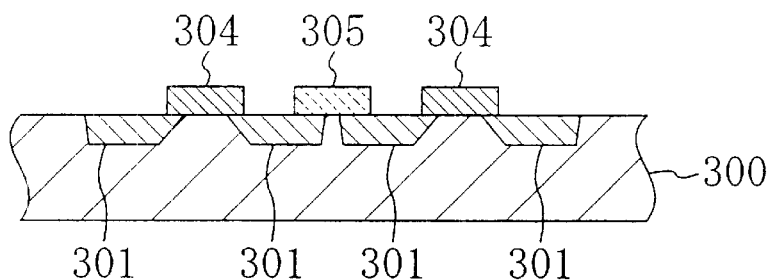
FIG. 12D
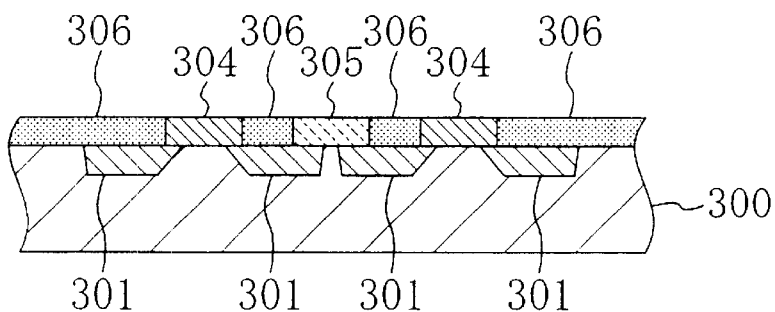

METHOD FOR FABRICATING SEMICONDUCTOR DEVICE

BACKGROUND OF THE INVENTION

The present invention relates to a method for fabricating a semiconductor device in which a gate electrode or an interconnect is formed by using a dummy gate electrode or a dummy interconnect.

Recently, in accordance with increased refinement of processing, a dummy electrode or a dummy interconnect is used in order to improve the accuracy in forming a gate electrode or an interconnect.

Now, a conventional method for fabricating a semiconductor device using a dummy gate electrode or a dummy interconnect will be described with reference to drawings.

FIGS. 26A through 26D are cross-sectional views for showing procedures in the conventional method for fabricating a semiconductor device.

First, as shown in FIG. 26A, gate electrodes 12 are formed on a semiconductor substrate 10 having a plurality of pairs of impurity diffusion layers 11 serving as the source or drain regions and selectively formed in surface portions thereof. Each gate electrode 12 is formed on the semiconductor substrate 10 between each pair of impurity diffusion layers 11. At this point, the gate electrodes 12 are densely disposed in a first region R1 on the semiconductor substrate 10 while they are sparsely disposed in a second region R2 on the semiconductor substrate 10. Simultaneously with the formation of the gate electrodes 12, dummy gate electrodes 13 are formed in accordance with the design rule for the gate electrodes 12 in portions of the second region R2 on the semiconductor substrate 10 where none of the impurity diffusion layers 11 and the gate electrodes 12 is formed. Thus, the gate electrodes 12 and the dummy gate electrodes 13 can be disposed uniformly on the semiconductor substrate 10 as a whole. Therefore, photolithography and etching employed for forming the gate electrodes 12 and the dummy gate electrodes 13 can be uniformly carried out, resulting in accurately forming the gate electrodes 12 and the dummy gate electrodes 13.

Next, as shown in FIG. 26B, a first interlayer insulating film 14 is formed over the semiconductor substrate 10, and thereafter, first-layer contacts 15 for selectively connecting the impurity diffusion layers 11 to upper layer interconnects (corresponding to metal interconnects 16 of FIG. 26C) are formed in the first interlayer insulating film 14.

Then, as shown in FIG. 26C, the interconnects 16 of a metal (hereinafter referred to as the metal interconnects) selectively connected to the first-layer contacts 15 are formed on the first interlayer insulating film 14. At this point, the metal interconnects 16 are densely disposed in a third region R3 on the semiconductor substrate 10 while they are sparsely disposed in a fourth region R4 on the semiconductor substrate 10. Simultaneously with the formation of the metal interconnects 16, dummy metal interconnects 17 are formed in accordance with the design rule for the metal interconnects 16 in portions of the fourth region R4 on the semiconductor substrate 10 where none of the first-layer contacts 15 and the metal interconnects 16 is formed. Thus, the metal interconnects 16 and the dummy metal interconnects 17 can be disposed uniformly on the semiconductor substrate 10 as a whole. Therefore, photolithography and etching employed for forming the metal interconnects 16 and the dummy metal interconnects 17 can be uniformly carried out, resulting in accurately forming the metal interconnects 16 and the dummy metal interconnects 17.

Next, as shown in FIG. 26D, a second interlayer insulating film 18 is formed over the semiconductor substrate 10, and thereafter, second-layer contacts 19 for selectively connecting the metal interconnects 16 to upper layer interconnects (not shown) are formed in the second interlayer insulating film 18.

In the conventional method for fabricating a semiconductor device, however, it is necessary to dispose the dummy gate electrodes 13 in consideration of the design rule for the gate electrodes 12 or the impurity diffusion layers 11 as well as it is necessary to dispose the dummy metal interconnects 17 in consideration of the design rule for the metal interconnects 16, the first-layer contacts 15 or the second-layer contacts 19. As a result, the circuit area of the resultant semiconductor device is disadvantageously increased.

SUMMARY OF THE INVENTION

In consideration of the aforementioned conventional problem, an object of the invention is preventing the increase of a circuit area in accurately forming a gate electrode or an interconnect by using a dummy gate electrode or a dummy interconnect.

In order to achieve the object, the first method for fabricating a semiconductor device of this invention comprises the steps of simultaneously forming a gate electrode and a dummy gate electrode on a semiconductor substrate; removing the dummy gate electrode; forming an interlayer insulating film on the semiconductor substrate after removing the dummy gate electrode; and forming, in the interlayer insulating film, a plug in a region overlapping with at least a part of a region where the dummy gate electrode has been disposed.

In the first method for fabricating a semiconductor device, after simultaneously forming the gate electrode and the dummy gate electrode, the dummy gate electrode is removed, and then, the interlayer insulating film is formed. Thereafter, the plug is formed in the interlayer insulating film so as to overlap with the region where the dummy gate electrode has been disposed. Therefore, with the accuracy in forming the gate electrode improved by using the dummy gate electrode, the region where the dummy gate electrode has been disposed can be used as the region for forming the plug for selective connection to an upper layer interconnect after removing the dummy gate electrode. Specifically, the area increase of the circuit derived from the use of the dummy gate electrode can be prevented, namely, the circuit area can be as small as that obtained without using the dummy gate. As a result, a semiconductor device having a high degree of integration and high performance can be realized.

In the first method for fabricating a semiconductor device, a photomask used for forming the dummy gate electrode is preferably used in removing the dummy gate electrode.

Thus, the dummy gate can be accurately removed, resulting in improving the reliability of the semiconductor device.

The second method for fabricating a semiconductor device of this invention comprises the steps of forming a pair of impurity diffusion layers serving as source and drain regions in surface portions of a semiconductor substrate; simultaneously forming a gate electrode on the semiconductor substrate between the pair of impurity diffusion layers and a dummy gate electrode on at least one of the pair of impurity diffusion layers; and removing the dummy gate electrode.

In the second method for fabricating a semiconductor device, after forming the gate electrode and the dummy gate electrode on one of the impurity diffusion layers provided on both sides of the gate electrode in the semiconductor substrate, the dummy gate electrode is removed. Therefore, with the accuracy in forming the gate electrode improved by using the dummy gate electrode, the region where the dummy gate electrode has been disposed can be used as a region for forming, for example, a plug for selectively connecting the impurity diffusion layer to an upper layer interconnect after removing the dummy gate electrode. Specifically, the increase of the circuit area derived from the use of the dummy gate electrode can be prevented, namely, the circuit area can be as small as that obtained without using the dummy gate electrode. As a result, a semiconductor device with a high degree of integration and high performance can be realized.

In the second method for fabricating a semiconductor device, a photomask used for forming the dummy gate electrode is preferably used in removing the dummy gate electrode.

Thus, the dummy gate electrode can be accurately removed, resulting in improving the reliability of the semiconductor device.

The second method for fabricating a semiconductor device can further comprise, after the step of removing the dummy gate electrode, the steps of forming an interlayer insulating film on the semiconductor substrate; and forming, in the interlayer insulating film, a plug in a region overlapping with at least a part of a region where the dummy gate electrode has been disposed.

The third method for fabricating a semiconductor device of this invention comprises the steps of simultaneously forming an interconnect and a dummy interconnect on a semiconductor substrate; removing the dummy interconnect; forming an interlayer insulating film on the semiconductor substrate after removing the dummy interconnect; and forming, in the interlayer insulating film, a plug in a region overlapping with at least a part of a region where the dummy interconnect has been disposed.

In the third method for fabricating a semiconductor device, after simultaneously forming the interconnect and the dummy interconnect, the dummy interconnect is removed, and then, the interlayer insulating film is formed. Thereafter, the plug is formed in the interlayer insulating film so as to overlap with the region where the dummy interconnect has been disposed. Therefore, with the accuracy in forming the interconnect improved by using the dummy interconnect, the region where the dummy interconnect has been disposed can be used as the region for forming the plug for selective connection to an upper layer interconnect after removing the dummy interconnect. Specifically, the increase of the circuit area derived from the use of the dummy interconnect can be prevented, namely, the circuit area can be as small as that obtained without using the dummy interconnect. As a result, a semiconductor device with a high degree of integration and high performance can be realized.

In the third method for fabricating a semiconductor device, a photomask used for forming the dummy interconnect is preferably used in removing the dummy interconnect.

Thus, the dummy interconnect can be accurately removed, resulting in improving the reliability of the semiconductor device.

The fourth method for fabricating a semiconductor device of this invention comprises the steps of forming, on a semiconductor substrate, an interlayer insulating film provided with a plug; simultaneously forming an interconnect on the interlayer insulating film and a dummy interconnect on the plug; and removing the dummy interconnect.

In the fourth method for fabricating a semiconductor device, after simultaneously forming the interconnect on the interlayer insulating film and the dummy interconnect on the plug formed in the interlayer insulating film, the dummy interconnect is removed. Therefore, with the accuracy in forming the interconnect improved by using the dummy interconnect, the region where the dummy interconnect has been disposed can be used as a region for forming, for example, a plug for selective connection to an upper layer interconnect after removing the dummy interconnect. Specifically, the increase of the circuit area derived from the use of the dummy interconnect can be prevented, namely, the circuit area can be as small as that obtained without using the dummy interconnect. As a result, a semiconductor device with a high degree of integration and high performance can be realized.

In the fourth method for fabricating a semiconductor device, a photomask used for forming the dummy interconnect is preferably used in removing the dummy interconnect.

Thus, the dummy interconnect can be accurately removed, resulting in improving the reliability of the semiconductor device.

The fourth method for fabricating a semiconductor device can further comprise, after the step of removing the dummy interconnect, the steps of forming a second interlayer insulating film on the interlayer insulating film; and forming, in the second interlayer insulating film, a second plug in a region overlapping with at least a part of a region where the dummy interconnect has been disposed.

The fifth method for fabricating a semiconductor device of this invention comprises the steps of simultaneously forming a virtual gate electrode and a dummy gate electrode on a semiconductor substrate; forming a first resist film on the semiconductor substrate in a region where none of the virtual gate electrode and the dummy gate electrode is formed; removing the virtual gate electrode and the dummy gate electrode; forming a second resist film in a recess from which the dummy gate electrode has been removed; and forming a gate electrode in a recess from which the virtual gate electrode has been removed.

In the fifth method for fabricating a semiconductor device, after simultaneously forming the virtual gate electrode and the dummy gate electrode on the semiconductor substrate, the first resist film is formed in the region where none of the virtual gate electrode and the dummy gate electrode is formed, and then, the virtual gate electrode and the dummy gate electrode are removed. Thereafter, the second resist film is formed in the recess from which the dummy gate electrode has been removed, and then, the gate electrode is formed in the recess from which the virtual gate electrode has been removed. Therefore, the accuracy in forming the virtual gate electrode, namely, the accuracy in forming the gate electrode improved by using the dummy gate electrode, the region where the dummy gate electrode has been disposed can be used for forming, for example, a plug for selective connection to an upper layer interconnect after removing the dummy gate electrode. Specifically, the increase of the circuit area derived from the use of the dummy gate electrode can be prevented, namely, the circuit area can be as small as that obtained without using the dummy gate electrode. As a result, a semiconductor device with a high degree of integration and high performance can be realized.

In the fifth method for fabricating a semiconductor device, a photomask used for forming the dummy gate electrode is preferably used in forming the second resist film.

Thus, the second resist film can be accurately formed in the recess from which the dummy gate electrode has been removed, resulting in improving the reliability of the semiconductor device.

The sixth method for fabricating a semiconductor device of this invention comprises the steps of simultaneously forming a virtual interconnect and a dummy interconnect on a semiconductor substrate; forming a first resist film on the semiconductor substrate in a region where none of the virtual interconnect and the dummy interconnect is formed; removing the virtual interconnect and the dummy interconnect; forming a second resist film in a recess from which the dummy interconnect has been removed; and forming an interconnect in a recess from which the virtual interconnect has been removed.

In the sixth method for fabricating a semiconductor device, after simultaneously forming the virtual interconnect and the dummy interconnect on the semiconductor substrate, the first resist film is formed in the region where none of the virtual interconnect and the dummy interconnect is formed, and then, the virtual interconnect and the dummy interconnect are removed. Thereafter, the second resist film is formed in the recess from which the dummy interconnect has been removed, and then, the interconnect is formed in the recess from which the virtual interconnect has been removed. Therefore, with the accuracy in forming the virtual interconnect, namely, the accuracy in forming the interconnect improved by using the dummy interconnect, the region where the dummy interconnect has been disposed can be used as a region for forming, for example, a plug for selective connection to an upper layer interconnect. Specifically, the increase of the circuit area derived from the use of the dummy interconnect can be prevented, namely, the circuit area can be as small as that obtained without using the dummy interconnect. As a result, a semiconductor device with a high degree of integration and high performance can be realized.

In the sixth method for fabricating a semiconductor device, a photomask used for forming the dummy interconnect is preferably used in forming the second resist film.

Thus, the second resist film can be accurately formed in the recess from which the dummy interconnect has been removed, resulting in improving the reliability of the semiconductor device.

BRIEF DESCRIPTION OF THE DRAWINGS

FIGS. 12A, 12B, 12C and 12D are cross-sectional views for showing procedures in a method for fabricating a semiconductor device according to Embodiment 3 of the invention;

DETAILED DESCRIPTION OF THE INVENTION

Embodiment 1

A method for fabricating a semiconductor device according to Embodiment 1 of the invention will now be described with reference to the accompanying drawings.

FIGS. 1A through 1D and 2A through 2D are crosssectional views for showing procedures in the method for fabricating a semiconductor device of Embodiment 1.

Figure 1A:
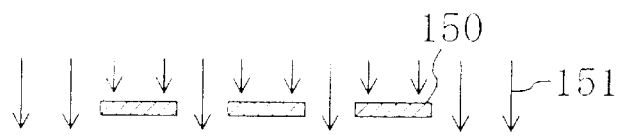
FIGS. 1A, 1B, 1C and 1D are cross-sectional views for showing procedures in a method for fabricating a semiconductor device according to Embodiment 1 of the invention.

First, as shown in FIG. 1A, a conducting film 102 and a positive first resist film 103 are successively formed on a semiconductor substrate 100 having a plurality of pairs of impurity diffusion layers 101 serving as the source or drain regions and selectively formed in surface portions thereof. Thereafter, the first resist film 103 is irradiated with first exposing light 151 through a first photomask 150. Thus, a portion of the first resist film 103 excluding portions corresponding to gate electrode forming regions and dummy gate electrode forming regions is exposed.

Figure 1B:
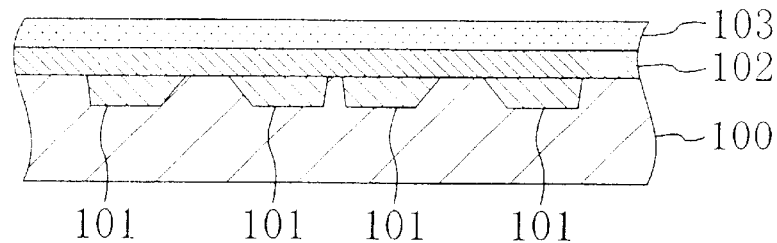

Next, the first resist film 103 is developed, thereby forming a first resist pattern 103A covering the gate electrode forming regions and the dummy gate electrode forming regions as shown in FIG. 1B. Thereafter, the conducting film 102 is dry etched by using the first resist pattern 103A as a mask, thereby selectively forming gate electrodes 104 and dummy gate electrodes 105. Each gate electrode 104 is formed on the semiconductor substrate 100 between each pair of the impurity diffusion layers 101. At this point, although not shown in the drawing, the gate electrodes 104 are densely provided in a first region on the semiconductor substrate 100 while they are sparsely disposed in a second region on the semiconductor substrate 100. Also, the dummy gate electrodes 105 are formed in the region on the semiconductor substrate 100 where the gate electrodes 104 are sparsely disposed (namely, in the second region). Furthermore, the dummy gate electrode 105 may be formed on the impurity diffusion layer 101.

Figure 1C:
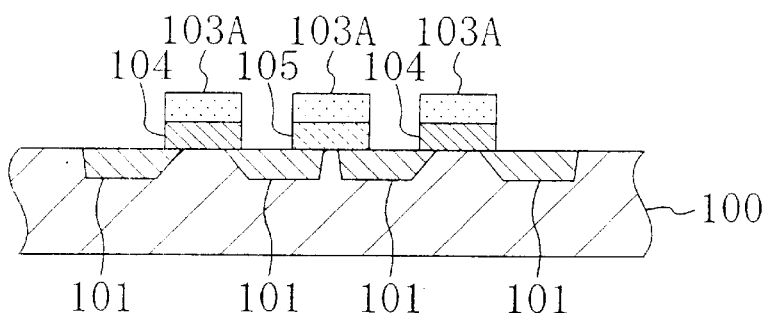
Figure 1D:
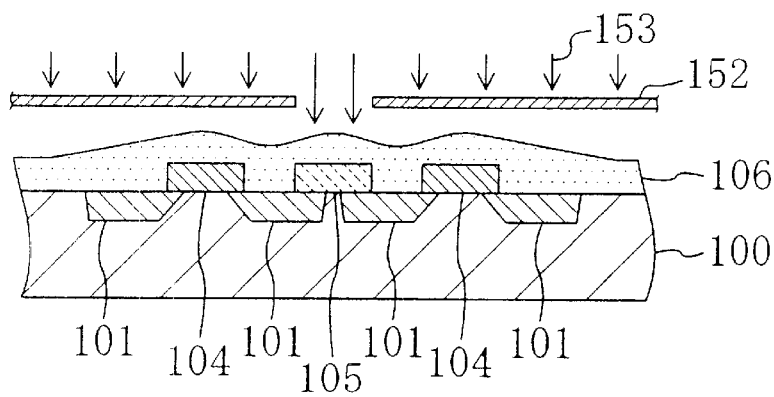

Next, after removing the first resist pattern 103A as shown in FIG. 1C, a positive second resist film 106 is formed over the semiconductor substrate 100 as shown in FIG. 1D. Then, the second resist film 106 is irradiated with second exposing light 153 through a second photomask 152. Thus, portions of the second resist film 106 formed on the dummy gate electrodes 105 are exposed.

Figure 2A:
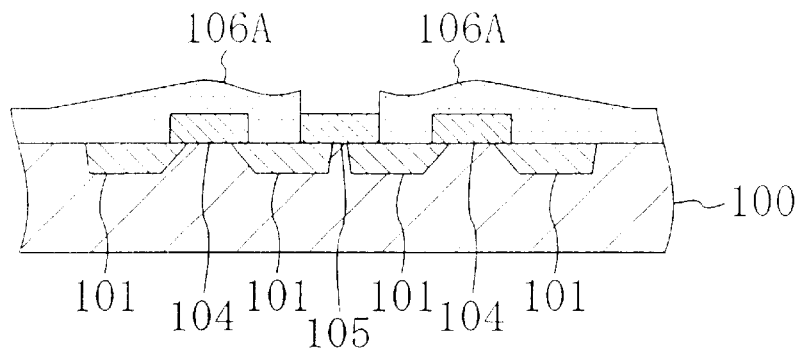
FIGS. 2A, 2B, 2C and 2D are cross-sectional views for showing other procedures in the method for fabricating a semiconductor device of Embodiment 1.
Figure 2B:
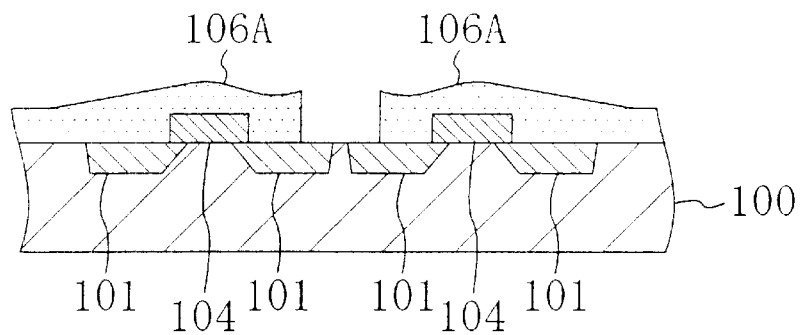

Subsequently, the second resist film 106 is developed, thereby forming a second resist pattern 106A covering a region other than the portions on the dummy gate electrodes 105 as shown in FIG. 2A. Then, the dummy gate electrodes 105 are dry etched by using the second resist pattern 106A as a mask, thereby removing the dummy gate electrodes 105 as shown in FIG. 2B.

Figure 2C:
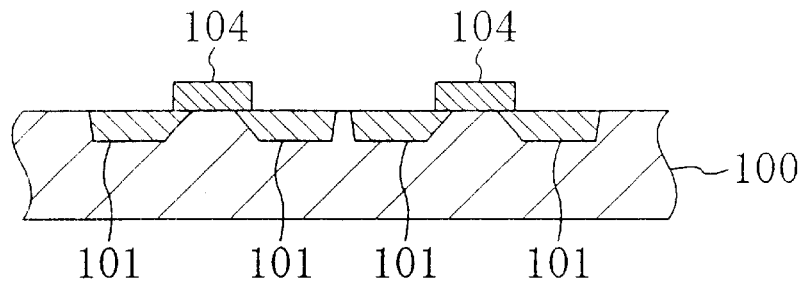
Figure 2D:
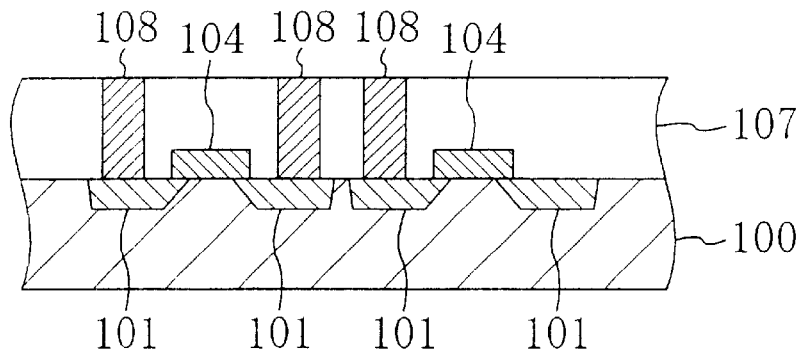

Next, after removing the second resist pattern 106A as shown in FIG. 2C, a first interlayer insulating film 107 is formed over the semiconductor substrate 100 as shown in FIG. 2D. Thereafter, first-layer contact plugs 108 for selectively connecting the impurity diffusion layers 101 to upper layer interconnects (not shown) are formed in the first interlayer insulating film 107. At this point, the firstlayer contact plug 108 may be formed to overlap with a region where the dummy gate electrode 105 has been disposed.

In this manner, according to Embodiment 1, after simultaneously forming the gate electrodes 104 and the dummy gate electrodes 105 on the semiconductor substrate 100 having the impurity diffusion layers 101 serving as the source or drain regions, the dummy gate electrodes 105 are removed, and then the first interlayer insulating film 107 is formed. Thereafter, the first-layer contact plugs 108 for connecting the impurity diffusion layers 101 to the upper layer interconnects are formed in the first interlayer insulating film 107. Therefore, when the first-layer contact plug 108 is formed so as to overlap with at least a part of the region where the dummy gate electrode 105 has been disposed, or when the dummy gate electrode 105 is formed on at least a part of the impurity diffusion layer 101, the following effect can be attained: With the accuracy in forming the gate electrodes 104 improved by using the dummy gate electrodes 105, the region where the dummy gate electrode 105 has been disposed can be used for forming the first-layer contact plug 108 after removing the dummy gate electrode 105. Accordingly, increase of the circuit area derived from the use of the dummy gate electrodes 105 can be prevented, namely, the circuit area can be as small as that obtained without using the dummy gate electrodes 105. As a result, a semiconductor device having a high degree of integration and high performance can be realized.

Although the region where the dummy gate electrode 105 has been disposed is used as the region for forming the first-layer contact plug 108 in Embodiment 1, the region where the dummy gate electrode 105 has been disposed may be used as a region for forming another composing element such as a gate electrode (having different design rule or the like from the gate electrodes 104) instead.

In Embodiment 1, there is no need to remove the dummy gate electrode if it does not affect the circuit area.

Modification of Embodiment 1

A method for fabricating a semiconductor device according to a modification of Embodiment 1 of the invention will now be described with reference to the accompanying drawings.

FIGS. 3A through 3C, 4A through 4C and 5A through 5C are cross-sectional views for showing procedures in the method for fabricating a semiconductor device according to the modification of Embodiment 1.

Figure 3A:
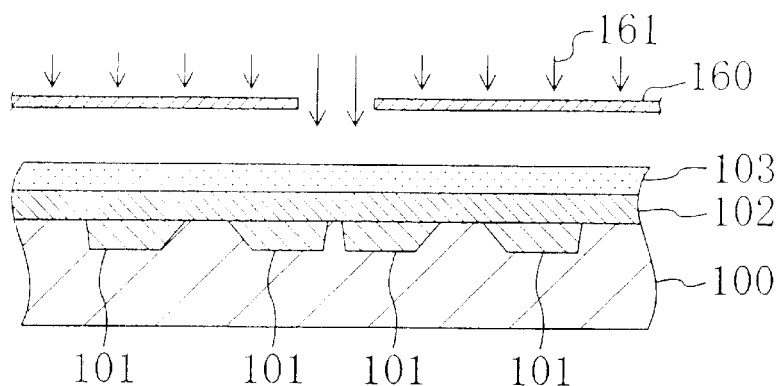
FIGS. 3A, 3B and 3C are cross-sectional views for showing procedures in a method for fabricating a semiconductor device according to a modification of Embodiment 1 of the invention.

First, as shown in FIG. 3A, a conducting film 102 and a negative first resist film 103 are successively formed on a semiconductor substrate 100 having a plurality of pairs of impurity diffusion layers 101 serving as the source or drain regions and selectively formed in surface portions thereof. Thereafter, the first resist film 103 is irradiated with first exposing light 161 through a first photomask 160. Thus, portions of the first resist film 103 corresponding to dummy gate electrode forming regions are exposed.

Figure 3B:
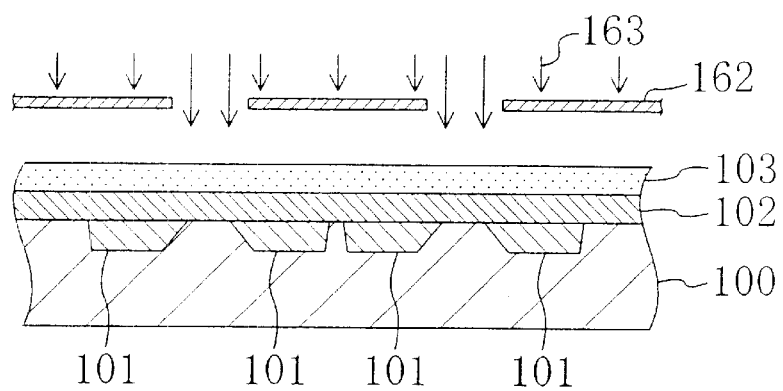

Next, as shown in FIG. 3B, the first resist film 103 is irradiated with second exposing light 163 through a second photomask 162. Thus, portions of the first resist film 103 corresponding to gate electrode forming regions are exposed.

Figure 3C:
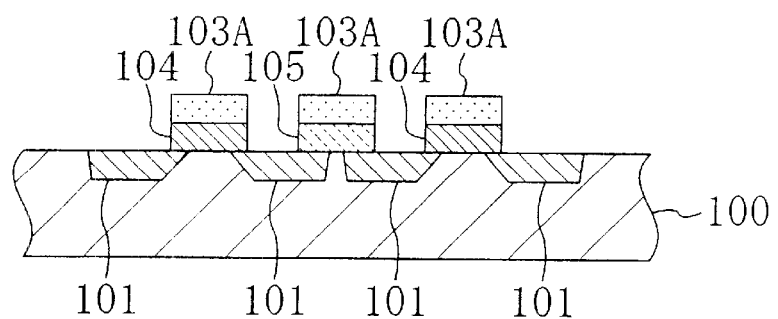

Then, the first resist film 103 is developed, thereby forming a first resist pattern 103A covering the gate electrode forming regions and the dummy gate electrode forming regions as shown in FIG. 3C. Then, the conducting film 102 is dry etched by using the first resist pattern 103A as a mask, thereby selectively forming gate electrodes 104 and dummy gate electrodes 105. Each gate electrode 104 is formed on the semiconductor substrate 100 between each pair of impurity diffusion layers 101. At this point, although not shown in the drawing, the gate electrodes 104 are densely disposed in a first region on the semiconductor substrate 100 while they are sparsely disposed in a second region on the semiconductor substrate 100. Furthermore, the dummy gate electrodes 105 are formed in the region on the semiconductor substrate 100 where the gate electrodes 104 are sparsely disposed (namely, in the second region). The dummy gate electrode 105 may be formed on the impurity diffusion layer 101.

Figure 4A:
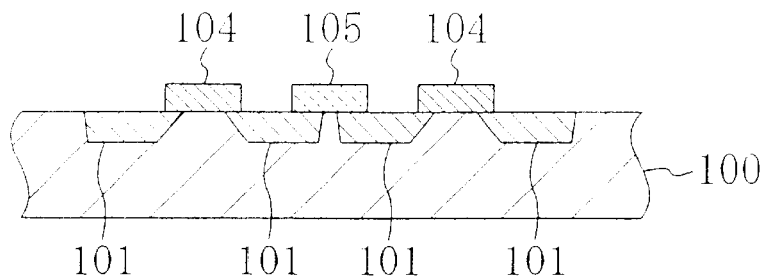
FIGS. 4A, 4B and 4C are cross-sectional views for showing other procedures in the method for fabricating a semiconductor device of the modification of Embodiment 1.
Figure 4B:
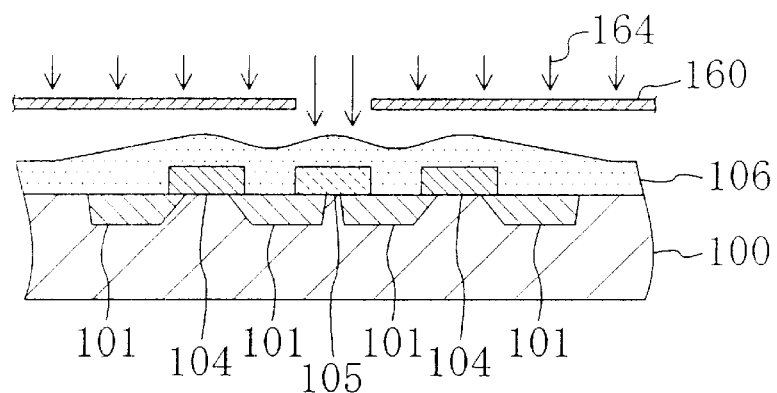

Subsequently, after removing the first resist pattern 103A as shown in FIG. 4A, a positive second resist film 106 is formed over the semiconductor substrate 100 as shown in FIG. 4B. Thereafter, the second resist film 106 is irradiated with third exposing light 164 through the first photomask 160 that is used in the procedure of FIG. 3A for exposing the portions of the first resist film 103 corresponding to the dummy gate electrode forming regions.

Figure 4C:
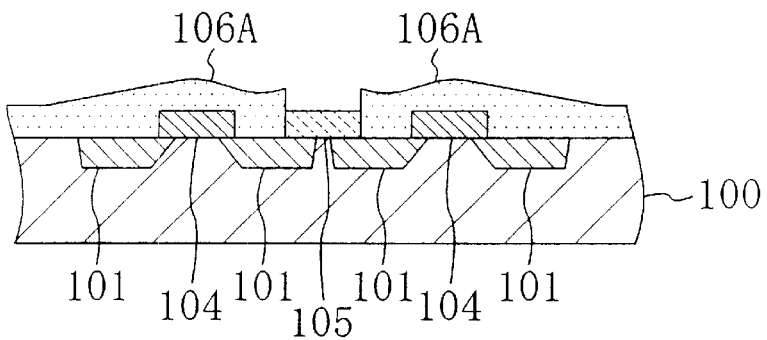
Figure 5A:
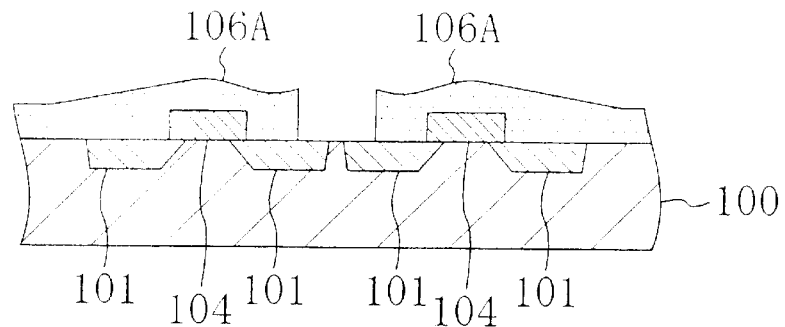
FIGS. 5A, 5B and 5C are cross-sectional views for showing still other procedures in the method for fabricating a semiconductor device of the modification of Embodiment 1.

Next, the second resist film 106 is developed, thereby forming a second resist pattern 106A covering a region excluding the portions on the dummy gate electrodes 105 as shown in FIG. 4C. Thereafter, the dummy gate electrodes 105 are dry etched by using the second resist pattern 106A as a mask, thereby removing the dummy gate electrodes 105 as shown in FIG. 5A.

Figure 5B:
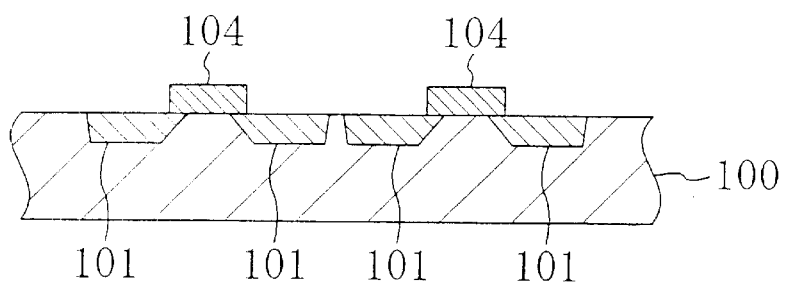
Figure 5C:
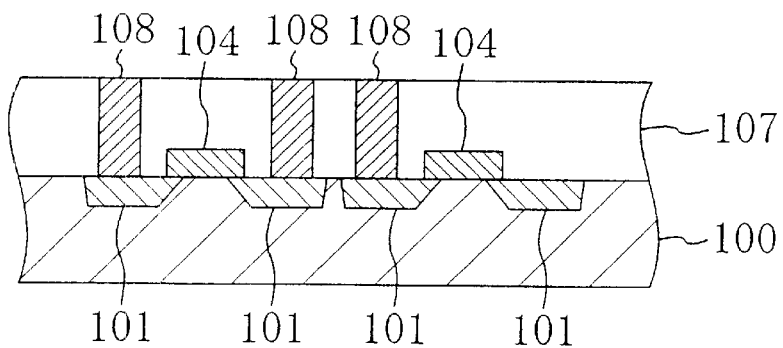

Then, after removing the second resist pattern 106A as shown in FIG. 5B, a first interlayer insulating film 107 is formed over the semiconductor substrate 100 as shown in FIG. 5C. Thereafter, first-layer contact plugs 108 for selectively connecting the impurity diffusion layers 101 to upper layer interconnects (not shown) are formed in the first interlayer insulating film 107. At this point, the first-layer contact plug 108 may be formed to overlap with a region where the dummy gate electrode 105 has been disposed.

In this manner, according to the modification of Embodiment 1, not only the effect of Embodiment 1 but also the following effect can be attained: Since the first photomask 160 used for forming the dummy gate electrodes 105 is used in removing the dummy gate electrodes 105, the dummy gate electrodes 105 can be accurately removed, resulting in improving the reliability of the semiconductor device.

Although the region where the dummy gate electrode 105 has been disposed is used as the region for forming the first-layer contact plug 108 in the modification of Embodiment 1, the region where the dummy gate electrode 105 has been disposed may be used as a region for forming another composing element such as a gate electrode (having different design rule or the like from the gate electrodes 104) instead.

In the modification of Embodiment 1, after exposing the portions of the first resist film 103 corresponding to the dummy gate electrode forming regions by using the first photomask 160 (in the procedure of FIG. 3A), the portions of the first resist film 103 corresponding to the gate electrode forming regions are exposed by using the second photomask 162 (in the procedure of FIG. 3B). Instead, after exposing the portions of the first resist film 103 corresponding to the gate electrode forming regions by using the second photomask 162, the portions of the first resist film 103 corresponding to the dummy gate electrode forming regions may be exposed by using the first photomask 160.

In the modification of Embodiment 1, there is no need to remove the dummy gate electrode if it does not affect the circuit area.

Embodiment 2

A method for fabricating a semiconductor device according to Embodiment 2 of the invention will now be described with reference to the accompanying drawings.

FIGS. 6A through 6C, 7A through 7C, 8A and 8B are cross-sectional views for showing procedures in the method for fabricating a semiconductor device of Embodiment 2.

As a premise of the fabrication method of Embodiment 2, gate electrodes 104 are formed on a semiconductor substrate 100 having a plurality of pairs of impurity diffusion layers 101 serving as the source or drain regions and selectively formed in surface portions thereof and a first interlayer insulating film 107 provided with first-layer contact plugs 108 connected to the impurity diffusion layers 101 is formed on the semiconductor substrate 100 and the gate electrodes 104 previously through the procedures of the fabrication method of, for example, Embodiment 1 or the modification of Embodiment 1 (specifically, through the procedures of FIGS. 1A through 1D and 2A through 2D or the procedures of FIGS. 3A through 3C, 4A through 4C and 5A through 5C).

Figure 6A:
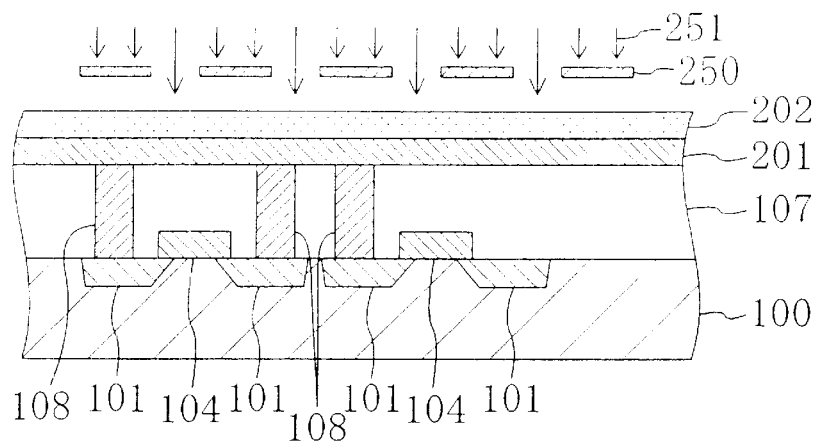
FIGS. 6A, 6B and 6C are cross-sectional views for showing procedures in a method for fabricating a semiconductor device according to Embodiment 2 of the invention.

First, as shown in FIG. 6A, a conducting film 201 and a positive first resist film 202 are successively formed over the first interlayer insulating film 107. Thereafter, the first resist film 202 is irradiated with first exposing light 251 through a first photomask 250. Thus, a portion of the first resist film 202 excluding portions corresponding to interconnect forming regions and dummy interconnect forming regions is exposed.

Figure 6B:
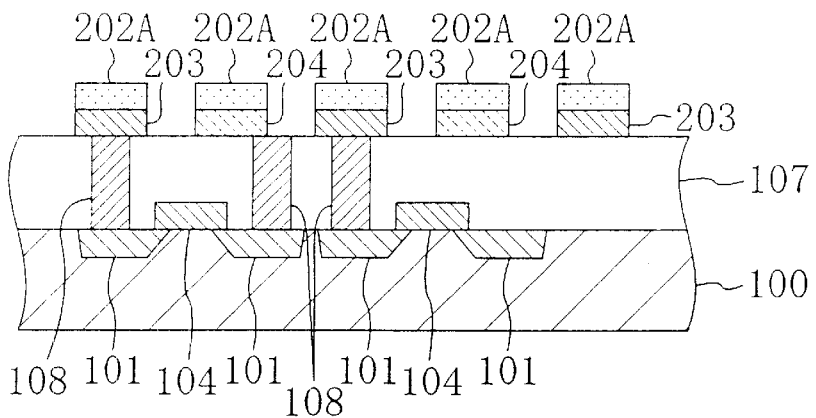

Next, the first resist film 202 is developed, thereby forming a first resist pattern 202A covering the interconnect forming regions and the dummy interconnect forming regions as shown in FIG. 6B. Thereafter, the conducting film 201 is dry etched by using the first resist pattern 202A as a mask, thereby selectively forming interconnects 203 and dummy interconnects 204. At this point, although not shown in the drawing, the interconnects 203 are densely disposed in a first region on the semiconductor substrate 100 while they are sparsely disposed in a second region on the semiconductor substrate 100. Also, the dummy interconnects 204 are formed in the region on the semiconductor substrate 100 where the interconnects 203 are sparsely disposed (namely, in the second region). Furthermore, the interconnects 203 are formed to be connected to the first-layer contact plugs 108. The dummy interconnect 204 may be formed on the first-layer contact plug 108.

Figure 6C:
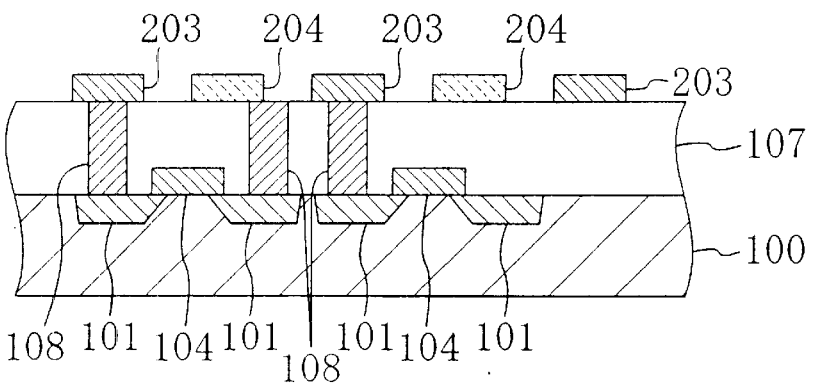
Figure 7A:
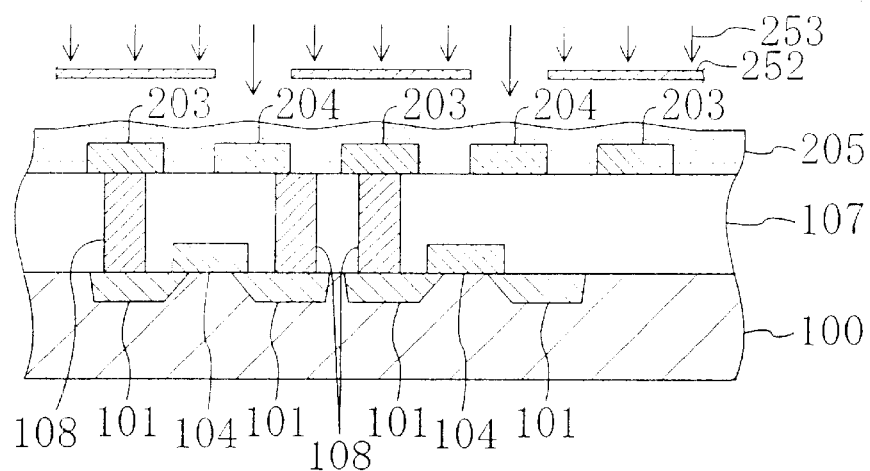
FIGS. 7A, 7B and 7C are cross-sectional views for showing other procedures in the method for fabricating a semiconductor device of Embodiment 2.

Then, after removing the first resist pattern 202A as shown in FIG. 6C, a positive second resist film 205 is formed over the first interlayer insulating film 107 as shown in FIG. 7A. Thereafter, the second resist film 205 is irradiated with second exposing light 253 through a second photomask 252. Thus, portions of the second resist film 205 formed on the dummy interconnects 204 are exposed.

Figure 7B:
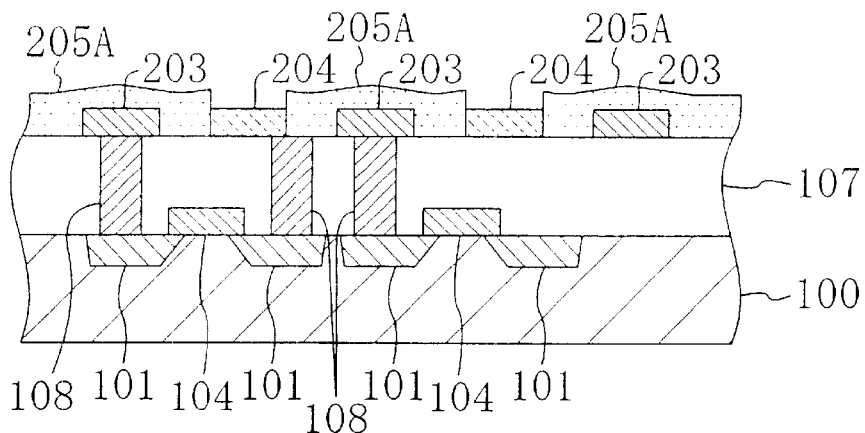
Figure 7C:
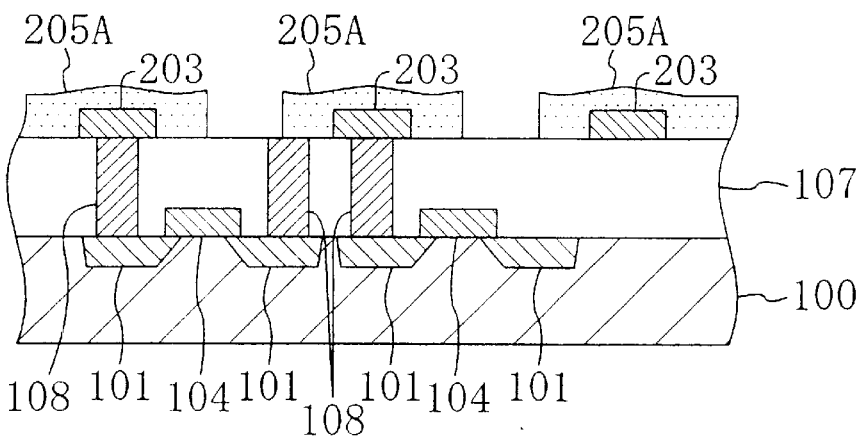

Next, the second resist film 205 is developed, thereby forming a second resist pattern 205A covering a region excluding the portions on the dummy interconnects 204 as shown in FIG. 7B. Thereafter, the dummy interconnects 204 are dry etched by using the second resist pattern 205A as a mask, thereby removing the dummy interconnects 204 as shown in FIG. 7C.

Figure 8A:
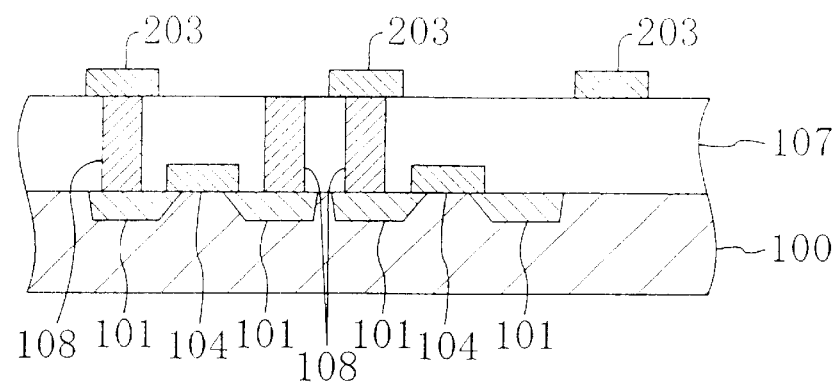
FIGS. 8A and 8B are cross-sectional views for showing still other procedures in the method for fabricating a semiconductor device of Embodiment 2.
Figure 8B:
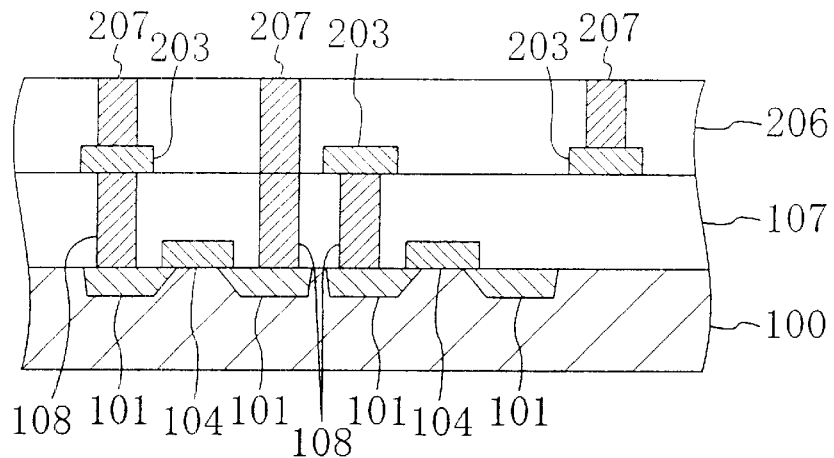

Subsequently, after removing the second resist pattern 205A as shown in FIG. 8A, a second interlayer insulating film 206 is formed over the first interlayer insulating film 107 as shown in FIG. 8B. Then, second-layer contact plugs 207 for selectively connecting the interconnects 203 or the first-layer contact plugs 108 to upper layer interconnects (not shown) are formed in the second interlayer insulating film 206. At this point, the second-layer contact plug 207 may be formed to overlap with a region where the dummy interconnect 204 has been disposed.

In this manner, according to Embodiment 2, after simultaneously forming the interconnects 203 and the dummy interconnects 204 on the first interlayer insulating film 107 provided with the first-layer contact plugs 108, the dummy interconnects 204 are removed, and then, the second interlayer insulating film 206 is formed. Thereafter, the second-layer contact plugs 207 for connecting the first-layer contact plugs 108 or the interconnects 203 to the upper layer interconnects are formed in the second interlayer insulating film 206. Therefore, when the second-layer contact plug 207 is formed so as to overlap with at least a part of the region where the dummy interconnect 204 has been disposed, or when the dummy interconnect 204 is formed on at least a part of the first-layer contact plug 108, the following effect can be attained: With the accuracy in forming the interconnects 203 improved by using the dummy interconnects 204, the region where the dummy interconnect 204 has been disposed can be used as the region for forming the second-layer contact plug 207 after removing the dummy interconnect 204. Accordingly, the increase of the circuit area derived from the use of the dummy interconnects 204 can be prevented, namely, the circuit area can be as small as that obtained without using the dummy interconnects 204. As a result, a semiconductor device having a high degree of integration and high performance can be realized.

Although the region where the dummy interconnect 204 has been disposed is used as the region for forming the second-layer contact plug 207 in Embodiment 2, the region where the dummy interconnect 204 has been disposed may be used as a region for forming another composing element such as a capacitor, a diode or a resistance instead.

In Embodiment 2, there is no need to remove the dummy interconnect if it does not affect the circuit area.

Modification of Embodiment 2

A method for fabricating a semiconductor device according to a modification of Embodiment 2 of the invention will now be described with reference to the accompanying drawings.

FIGS. 9A through 9C, 10A through 10C and 11A through 11C are cross-sectional views for showing procedures in the method for fabricating a semiconductor device of the modification of Embodiment 2.

As a premise of the fabrication method of the modification of Embodiment 2, gate electrodes 104 are formed on a semiconductor substrate 100 having a plurality of pairs of impurity diffusion layers 101 serving as the source or drain regions and selectively formed in surface portions thereof and a first interlayer insulating film 107 provided with first-layer contact plugs 108 connected to the impurity diffusion layers 101 is formed on the semiconductor substrate 100 and the gate electrodes 104 previously through the procedures of the fabrication method of, for example, Embodiment 1 or the modification of Embodiment 1 (specifically, through the procedures of FIGS. 1A through 1D and 2A through 2D or the procedures of FIGS. 3A through 3C, 4A through 4C and 5A through 5C).

Figure 9A:
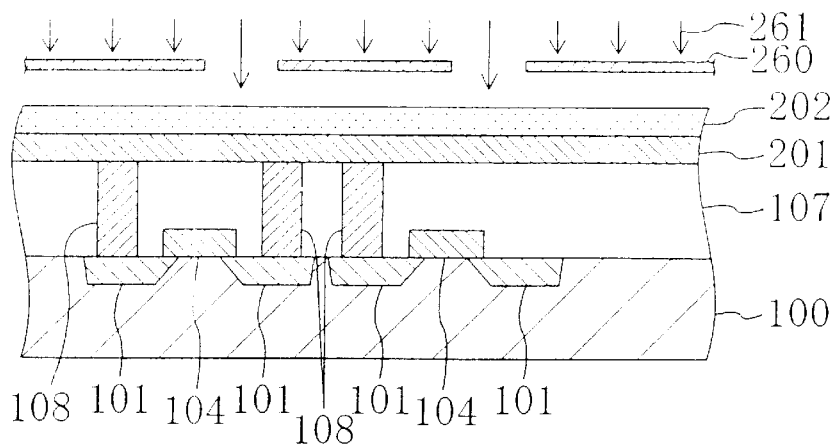
FIGS. 9A, 9B and 9C are cross-sectional views for showing procedures in a method for fabricating a semiconductor device according to a modification of Embodiment 2 of the invention.

First, as shown in FIG. 9A, a conducting film 201 and a negative first resist film 202 are successively formed over the first interlayer insulating film 107. Thereafter, the first resist film 202 is irradiated with first exposing light 261 through a first photomask 260. Thus, portions of the first resist film 202 corresponding to dummy interconnect forming regions are exposed.

Figure 9B:
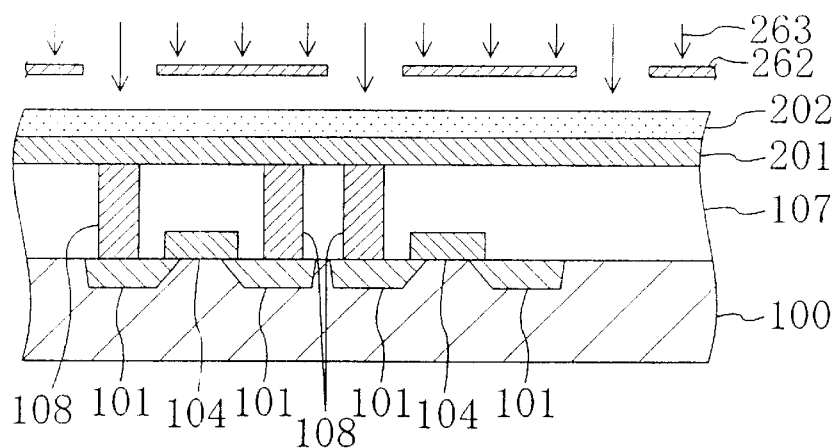

Next, as shown in FIG. 9B, the first resist film 202 is irradiated with second exposing light 263 through a second photomask 262. Thus, portions of the first resist film 202 corresponding to interconnect forming regions are exposed.

Figure 9C:
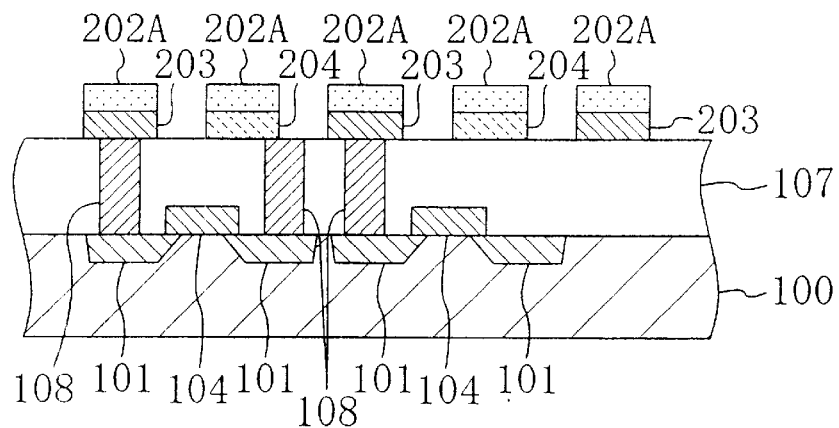

Then, the first resist film 202 is developed, thereby forming a first resist pattern 202A covering the interconnect forming regions and the dummy interconnect forming regions as shown in FIG. 9C. Thereafter, the conducting film 201 is dry etched by using the first resist pattern 202A as a mask, thereby selectively forming interconnects 203 and dummy interconnects 204. At this point, although not shown in the drawing, the interconnects 203 are densely disposed in a first region on the semiconductor substrate 100 while they are sparsely disposed in a second region on the semiconductor substrate 100. Also, the dummy interconnects 204 are formed in the region on the semiconductor substrate 100 where the interconnects 203 are sparsely disposed (namely, in the second region). Furthermore, the interconnects 203 are formed to be connected to the first-layer contact plugs 108. The dummy interconnect 204 may be formed on the first-layer contact plug 108.

Figure 10A:
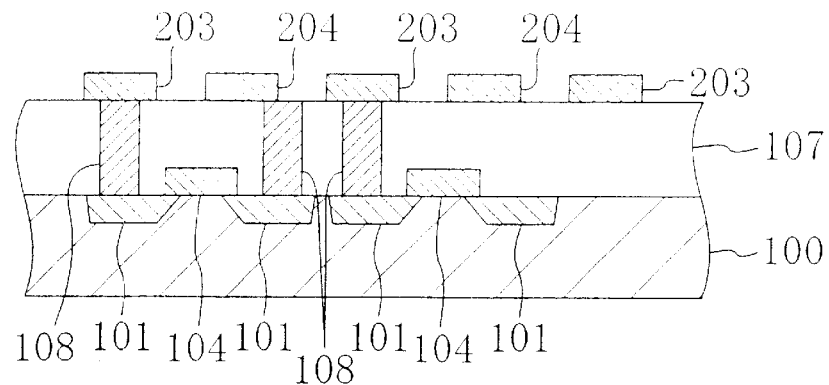
FIGS. 10A, 10B and 10C are cross-sectional views for showing other procedures in the method for fabricating a semiconductor device of the modification of Embodiment 2.
Figure 10B:
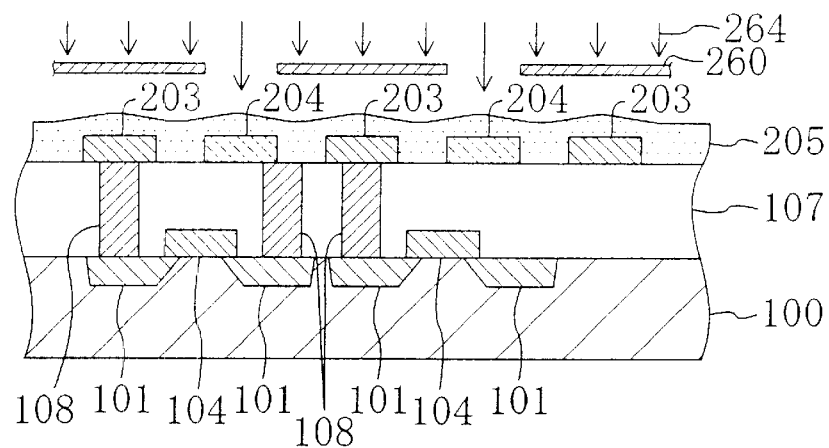

Next, after removing the first resist pattern 202A as shown in FIG. 10A, a positive second resist film 205 is formed over the first interlayer insulating film 107 as shown in FIG. 10B. Thereafter, the second resist film 205 is irradiated with third exposing light 264 through the first photomask 260 that is used in the procedure of FIG. 9A for exposing the portions of the first resist film 202 corresponding to the dummy interconnect forming regions.

Figure 10C:
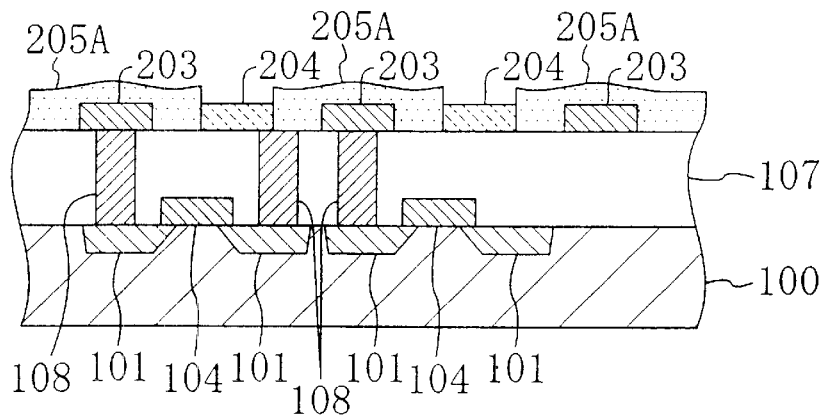
Figure 11A:
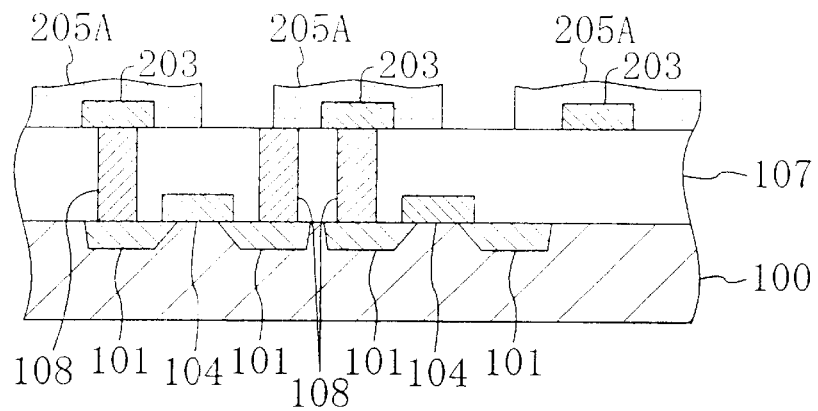
FIGS. 11A, 11B and 11C are cross-sectional views for showing still other procedures in the method for fabricating a semiconductor device of the modification of Embodiment 2.

Subsequently, the second resist film 205 is developed, thereby forming a second resist pattern 205A covering a region excluding portions on the dummy interconnects 204 as shown in FIG. 10C. Thereafter, the dummy interconnects 204 are dry etched by using the second resist pattern 205A as a mask, thereby removing the dummy interconnects 204 as shown in FIG. 11A.

Figure 11B:
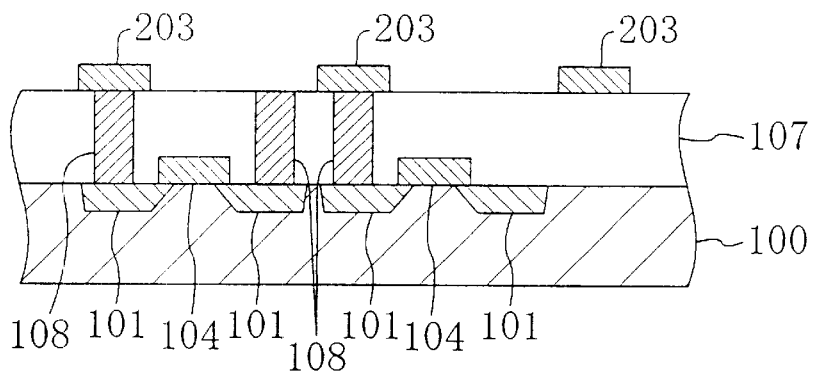
Figure 11C:
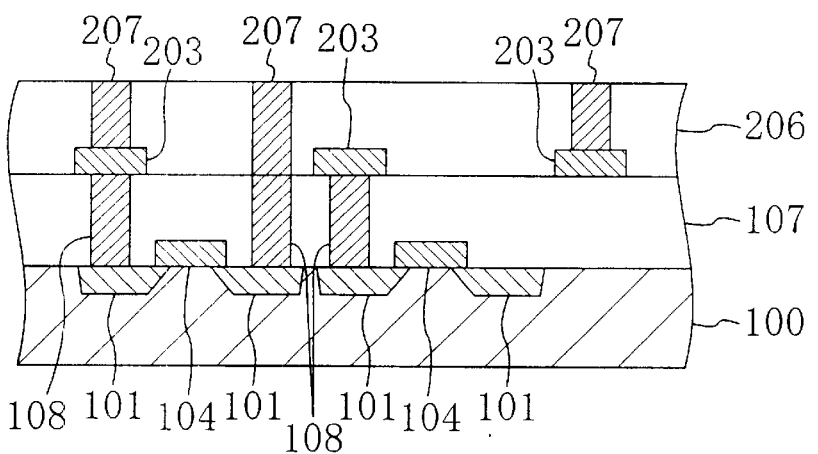

Next, after removing the second resist pattern 205A as shown in FIG. 11B, a second interlayer insulating film 206 is formed over the first interlayer insulating film 107 as shown in FIG. 11C. Thereafter, second-layer contact plugs 207 for selectively connecting the interconnects 203 or the first-layer contact plugs 108 to upper layer interconnects (not shown) are formed in the second interlayer insulating film 206. At this point, the second-layer contact plug 207 may be formed to overlap with a region where the dummy interconnect 204 has been disposed.

In this manner, according to the modification of Embodiment 2, not only the effect of Embodiment 2 but also the following effect can be attained: Since the first photomask 260 used for forming the dummy interconnects 204 is used in removing the dummy interconnects 204, the dummy interconnects 204 can be accurately removed, resulting in improving the reliability of the semiconductor device.

Although the region where the dummy interconnect 204 has been disposed is used as the region for forming the second-layer contact plug 207 in the modification of Embodiment 2, the region where the dummy interconnect 204 has been disposed may be used as a region for forming another composing element such as a capacitor, diode or resistance instead.

In the modification of Embodiment 2, after exposing the portions of the first resist film 202 corresponding to the dummy interconnect forming regions by using the first photomask 260 (in the procedure of FIG. 9A), the portions of the first resist film 202 corresponding to the interconnect forming regions are exposed by using the second photomask 262 (in the procedure of FIG. 9B). Instead, after exposing the portions of the first resist film 202 corresponding to the interconnect forming regions by using the second photomask 262, the portions of the first resist film 202 corresponding to the dummy interconnect forming regions may be exposed by using the first photomask 260.

In the modification of Embodiment 2, there is no need to remove the dummy gate electrode if it does not affect the circuit area.

Embodiment 3

A method for fabricating a semiconductor device according to Embodiment 3 of the invention will now be described with reference to the accompanying drawings.

FIGS. 12A through 12D, 13A through 13D, 14A and 14B are cross-sectional views for showing procedures in the method for fabricating a semiconductor device of Embodiment 3.

First, as shown in FIG. 12A, a conducting film 302 and a positive first resist film 303 are successively formed on a semiconductor substrate 300 having a plurality of pairs of impurity diffusion layers 301 serving as the source or drain regions and selectively formed in surface portions thereof. Thereafter, the first resist film 303 is irradiated with first exposing light 351 through a first photomask 350. Thus, a portion of the first resist film 303 excluding portions corresponding to gate electrode forming regions and dummy gate electrode forming regions is exposed.

Next, the first resist film 303 is developed, thereby forming a first resist pattern 303A covering the gate electrode forming regions and the dummy gate electrode forming regions as shown in FIG. 12B. Thereafter, the conducting film 302 is dry etched by using the first resist pattern 303A as a mask, thereby selectively forming virtual gate electrodes 304 and dummy gate electrodes 305. Each virtual gate electrode 304 is formed on the semiconductor substrate 300 between each pair of impurity diffusion layers 301. At this point, although not shown in the drawing, the virtual gate electrodes 304 are densely disposed in a first region on the semiconductor substrate 300 while they are sparsely disposed in a second region on the semiconductor substrate 300. Also, the dummy gate electrodes 305 are formed in the region on the semiconductor substrate 300 where the virtual gate electrodes 304 are sparsely disposed (namely, in the second region). The dummy gate electrode 305 may be formed on the impurity diffusion layer 301.

Next, after removing the first resist pattern 303A as shown in FIG. 12C, a second resist film 306 (corresponding to a first resist film of claim 11) is formed in a region on the semiconductor substrate 300 (including portions on the impurity diffusion layers 301) where none of the virtual gate electrodes 304 and the dummy gate electrodes 305 is disposed as shown in FIG. 12D.

Figure 13A:
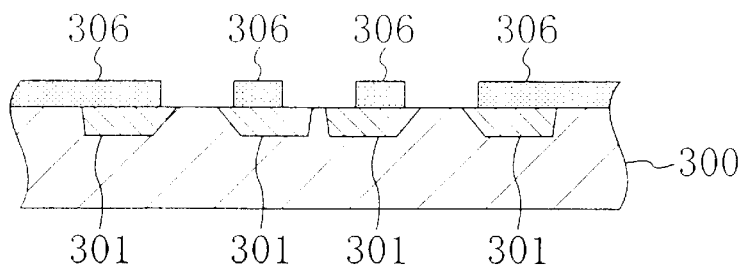
FIGS. 13A, 13B, 13C and 13D are cross-sectional views for showing other procedures in the method for fabricating a semiconductor device of Embodiment 3.
Figure 13B:
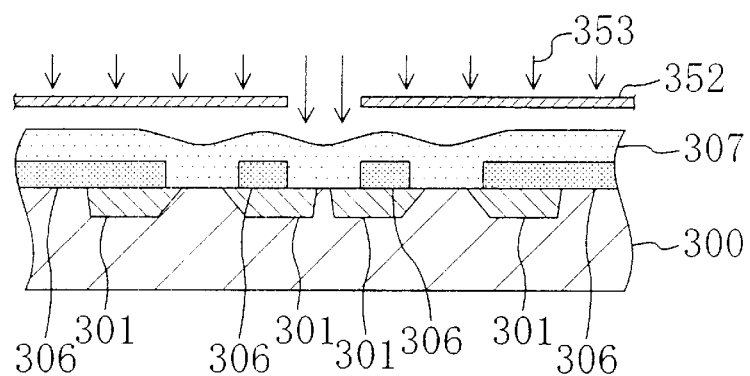

Then, after removing the virtual gate electrodes 304 and the dummy gate electrodes 305 as shown in FIG. 13A, a negative third resist film 307 is formed over the semiconductor substrate 300 as shown in FIG. 13B. Thereafter, the third resist film 307 is irradiated with second exposing light 353 through a second photomask 352. Thus, portions of the third resist film 307 corresponding to regions where the dummy gate electrodes 305 have been disposed are irradiated.

Figure 13C:
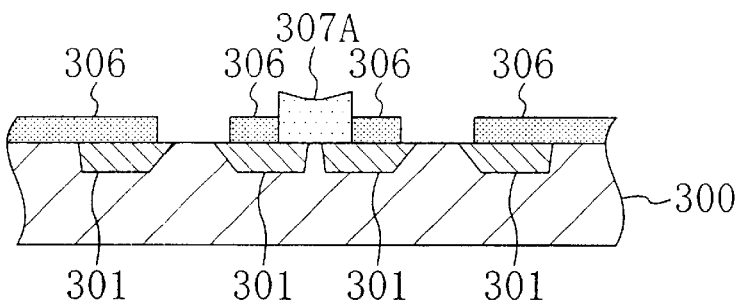

Subsequently, the third resist film 307 is developed, thereby forming a second resist pattern 307A (corresponding to a second resist film of claim 11) in recesses from which the dummy gate electrodes 305 have been removed as shown in FIG. 13C. In other words, the third resist film 307 is allowed to remain merely in the recesses from which the dummy gate electrodes 305 have been removed.

Figure 13D:
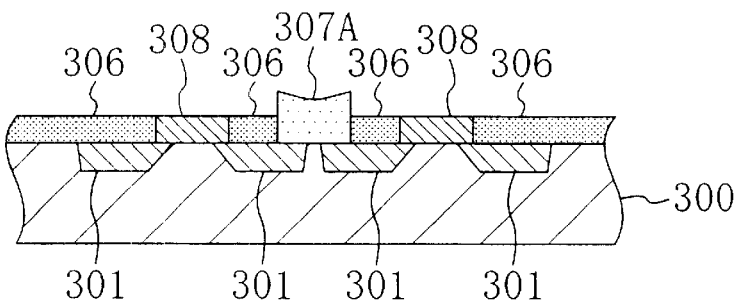
Figure 14A:
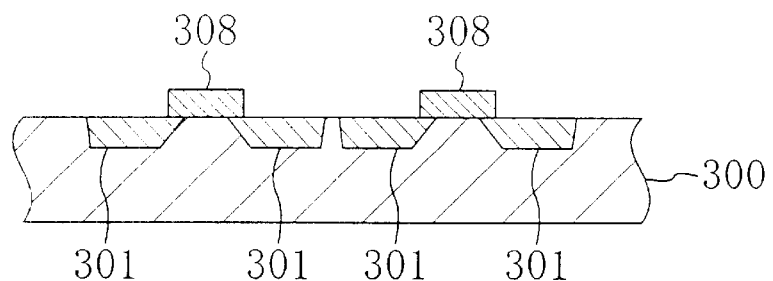
FIGS. 14A and 14B are cross-sectional views for showing still other procedures in the method for fabricating a semiconductor device of Embodiment 3.

Next, as shown in FIG. 13D, gate electrodes 308 are formed in recesses from which the virtual gate electrodes 304 have been removed. Thereafter, the second resist film 306 and the second resist pattern 307A (namely, the third resist film 307) are removed as shown in FIG. 14A.

Figure 14B:
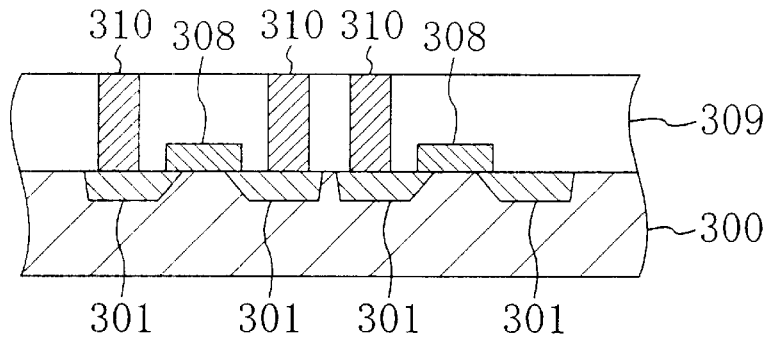

Then, as shown in FIG. 14B, a first interlayer insulating film 309 is formed over the semiconductor substrate 300. Thereafter, first-layer contact plugs 310 for selectively connecting the impurity diffusion layers 301 to upper layer interconnects (not shown) are formed in the first interlayer insulating film 309. At this point, the first-layer contact plug 310 may be formed to overlap with a region where the dummy gate electrode 305 has been disposed.

In this manner, according to Embodiment 3, after simultaneously forming the virtual gate electrodes 304 and the dummy gate electrodes 305 on the semiconductor substrate 300, the second resist film 306 is formed in the region where none of the virtual gate electrodes 304 and the dummy gate electrodes 305 is formed, and then, the virtual gate electrodes 304 and the dummy gate electrodes 305 are removed. Thereafter, the second resist pattern 307A is formed in the recesses from which the dummy gate electrodes 305 have been removed, and then, the gate electrodes 308 are formed in the recesses from which the virtual gate electrodes 304 have been removed. Therefore, with the accuracy in forming the virtual gate electrodes 304, namely, the accuracy in forming the gate electrodes 308, improved by using the dummy gate electrodes 305, the region where the dummy gate electrode 305 has been disposed can be used as a region for forming, for example, the first-layer contact plug 310 for connecting the impurity diffusion layer 301 to the upper layer interconnect after removing the dummy gate electrode 305. Accordingly, the increase of the circuit area derived from the use of the dummy gate electrodes 305 can be prevented, namely, the circuit area can be as small as that obtained without using the dummy gate electrodes 305. As a result, a semiconductor device having a high degree of integration and high performance can be realized.

Although the region where the dummy gate electrode 305 has been disposed is used as the region for forming the first-layer contact plug 310 in Embodiment 3, the region where the dummy gate electrode 305 has been disposed may be used as a region for forming another composing element such as a gate electrode (having different design rule or the like from the gate electrodes 308) instead.

In Embodiment 3, there is no need to remove the dummy gate electrode if it does not affect the circuit area.

Modification of Embodiment 3

A method for fabricating a semiconductor device according to a modification of Embodiment 3 will now be described with reference to the accompanying drawings.

FIGS. 15A through 15D, 16A through 16D and 17A through 17C are cross-sectional views for showing procedures in the method for fabricating a semiconductor device of the modification of Embodiment 3.

Figure 15A:
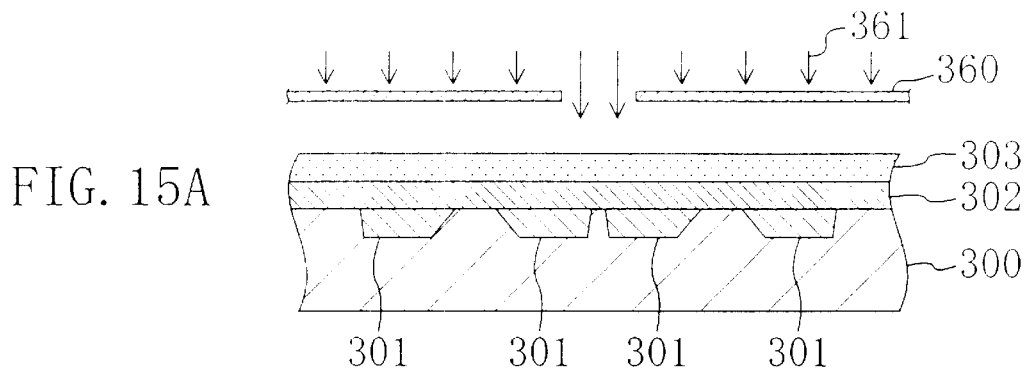
FIGS. 15A, 15B, 15C and 15D are cross-sectional views for showing procedures in a method for fabricating a semiconductor device according to a modification of Embodiment 3 of the invention.

First, as shown in FIG. 15A, a conducting film 302 and a negative first resist film 303 are successively formed on a semiconductor substrate 300 having a plurality of pairs of impurity diffusion layers 301 serving as the source or drain regions and selectively formed in surface portions thereof. Thereafter, the first resist film 303 is irradiated with first exposing light 361 through a first photomask 360. Thus, portions of the first resist film 303 corresponding to dummy gate electrode forming regions are exposed.

Figure 15B:
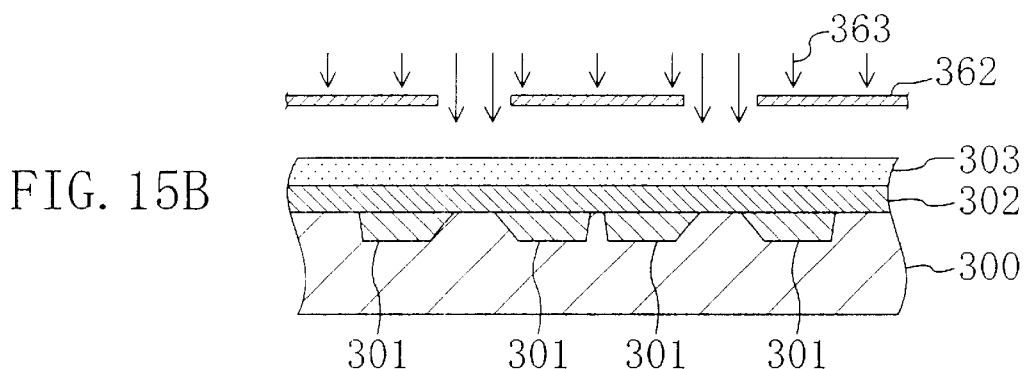

Next, as shown in FIG. 15B, the first resist film 303 is irradiated with second exposing light 363 through a second photomask 362. Thus, portions of the first resist film 303 corresponding to gate electrode forming regions are exposed.

Figure 15C:
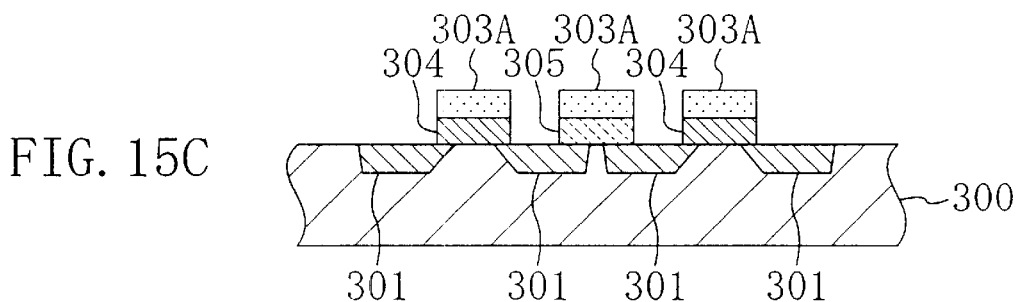

Then, the first resist film 303 is developed, thereby forming a first resist pattern 303A covering the gate electrode forming regions and the dummy gate electrode forming regions as shown in FIG. 15C. Thereafter, the conducting film 302 is dry etched by using the first resist pattern 303A as a mask, thereby selectively forming virtual gate electrodes 304 and dummy gate electrodes 305. Each virtual gate electrodes 304 is formed on the semiconductor substrate 300 between each pair of impurity diffusion layers 301. At this point, although not shown in the drawing, the virtual gate electrodes 304 are densely disposed in a first region on the semiconductor substrate 300 while they are sparsely disposed in a second region on the semiconductor substrate 300. Also, the dummy gate electrodes 305 are formed in the region on the semiconductor substrate 300 where the virtual gate electrodes 304 are sparsely disposed (namely, in the second region). The dummy gate electrode 305 may be formed on the impurity diffusion layer 301.

Figure 15D:
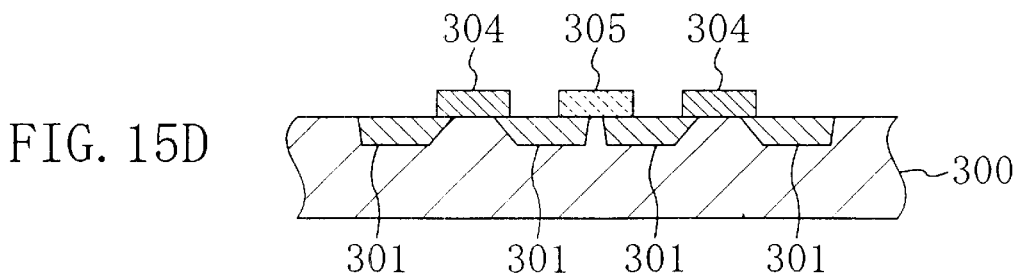
Figure 16A:
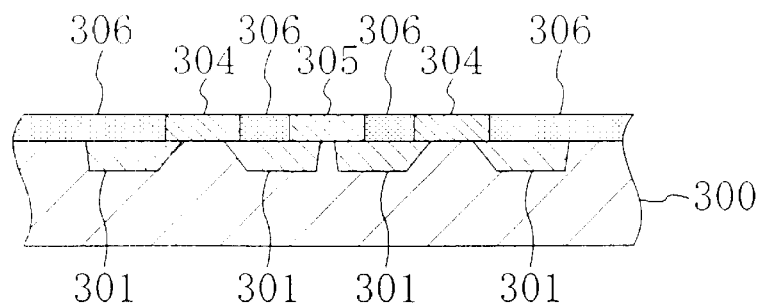
FIGS. 16A, 16B, 16C and 16D are cross-sectional views for showing other procedures in the method for fabricating a semiconductor device of the modification of Embodiment 3.

Next, after removing the first resist pattern 303A as shown in FIG. 15D, a second resist film 306 (corresponding to a first resist film of claim 11) is formed in a region on the semiconductor substrate 300 (including portions on the impurity diffusion layers 301) where none of the virtual gate electrodes 304 and the dummy gate electrodes 305 is formed as shown in FIG. 16A.

Figure 16B:
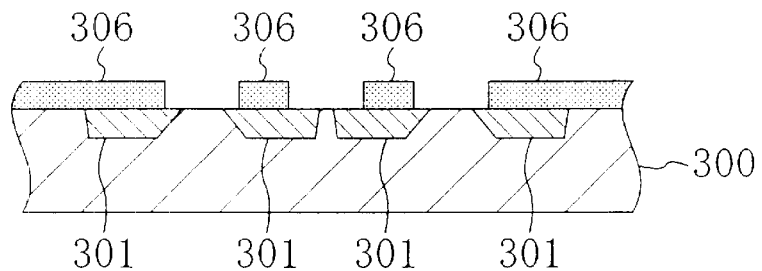
Figure 16C:
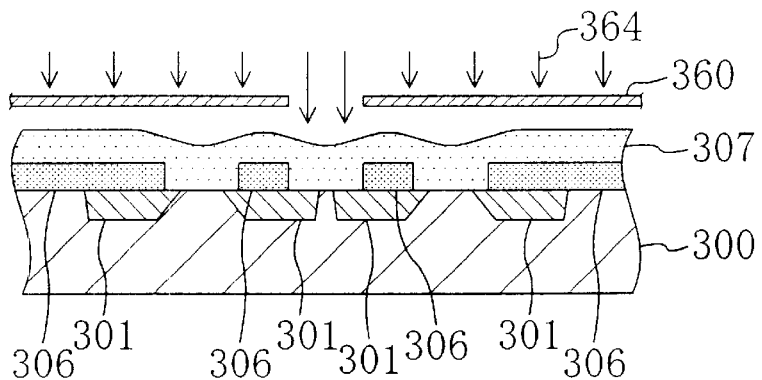

Then, after removing the virtual gate electrodes 304 and the dummy gate electrodes 305 as shown in FIG. 16B, a negative third resist film 307 is formed over the semiconductor substrate 300 as shown in FIG. 16C. Thereafter, the third resist film 307 is irradiated with third exposing light 364 through the first photomask 360 that is used in the procedure of FIG. 15A for exposing the portions of the first resist film 303 corresponding to the dummy gate electrode forming regions. Thus, portions of the third resist film 307 corresponding to regions where the dummy gate electrodes 305 have been disposed are exposed.

Figure 16D:
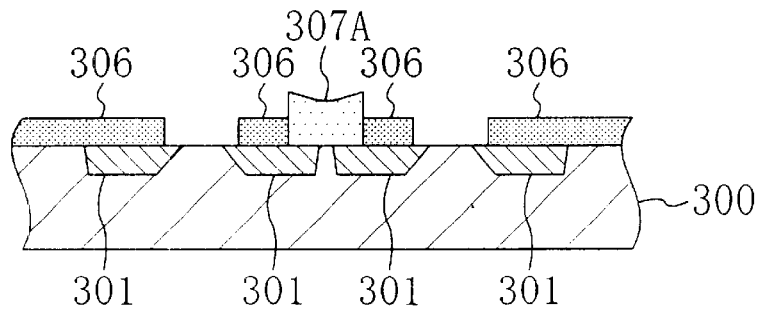

Subsequently, the third resist film 307 is developed, thereby forming a second resist pattern 307A (corresponding to a second resist film of claim 11) in recesses from which the dummy gate electrodes 305 have been removed as shown in FIG. 16D. In other words, the third resist film 307 is allowed to remain merely in the recesses from which the dummy gate electrodes 305 have been removed.

Figure 17A:
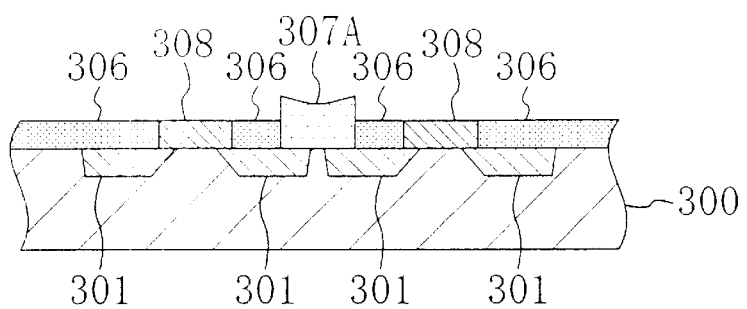
FIGS. 17A, 17B and 17C are cross-sectional views for showing still other procedures in the method for fabricating a semiconductor device of the modification of Embodiment 3.
Figure 17B:
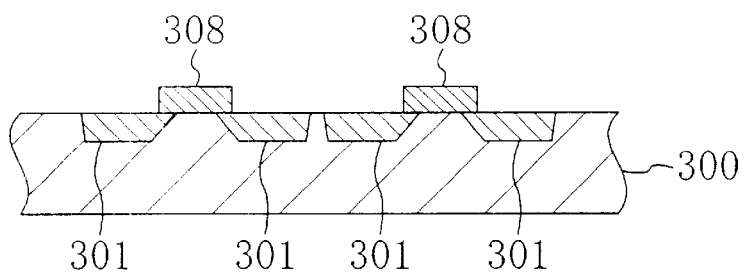

Next, as shown in FIG. 17A, gate electrodes 308 are formed in recesses from which the virtual gate electrodes 304 have been removed. Thereafter, the second resist film 306 and the second resist pattern 307A are removed as shown in FIG. 17B.

Figure 17C:
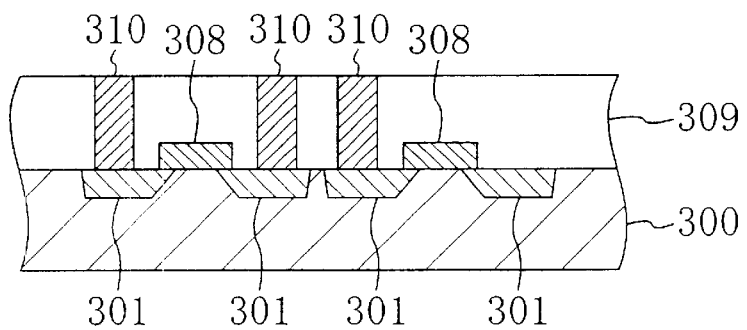

Then, as shown in FIG. 17C, a first interlayer insulating film 309 is formed over the semiconductor substrate 300. Thereafter, first-layer contact plugs 310 for selectively connecting the impurity diffusion layers 301 to upper layer interconnects (not shown) are formed in the first interlayer insulating film 309. At this point, the first-layer contact plug 310 may be formed to overlap with a region where the dummy gate electrode 305 has been disposed.

In this manner, according to the modification of Embodiment 3, not only the effect of Embodiment 3 but also the following effect can be attained: Since the first photomask 360 used for forming the gate electrodes 305 is used in forming the second resist pattern 307A in the recesses from which the dummy gate electrodes 305 have been removed, the second resist pattern 307A can be accurately formed, resulting in improving the reliability of the semiconductor device.

Although the region where the dummy gate electrode 305 has been disposed is used as the region for forming the first-layer contact plug 310 in the modification of Embodiment 3, the region where the dummy gate electrode 305 has been disposed may be used as a region for forming another composing element such as a gate electrode (having different design rule or the like from the gate electrodes 308) instead.

In the modification of Embodiment 3, after exposing the portions of the first resist film 303 corresponding to the dummy gate electrode forming regions by using the first photomask 360 (in the procedure of FIG. 15A), the portions of the first resist film 303 corresponding to the gate electrode forming regions are exposed by using the second photomask 362 (in the procedure of FIG. 15B). Instead, after exposing the portions of the first resist film 303 corresponding to the gate electrode forming regions by using the second photomask 362, the portions of the first resist film 303 corresponding to the dummy gate electrode forming regions may be exposed by using the first photomask 360.

In the modification of Embodiment 3, there is no need to remove the dummy gate electrode if it does not affect the circuit area.

Embodiment 4

A method for fabricating a semiconductor device according to Embodiment 4 of the invention will now be described with reference to the accompanying drawings.

FIGS. 18A through 18C, 19A through 19C, 20A, 20B, 21A and 21B are cross-sectional views for showing procedures in the method for fabricating a semiconductor device of Embodiment 4.

As a premise of the fabrication method of Embodiment 4, gate electrodes 308 are formed on a semiconductor substrate 300 having a plurality of pairs of impurity diffusion layers 301 serving as the source or drain regions and selectively formed in surface portions thereof and a first interlayer insulating film 309 provided with first-layer contact plugs 310 connected to the impurity diffusion layers 301 is formed on the semiconductor substrate 300 and the gate electrodes 308 previously through the procedures of the fabrication method of, for example, Embodiment 3 or the modification of Embodiment 3 (specifically, through the procedures of FIGS. 12A through 12D, 13A through 13D, 14A and 14B or the procedures of FIGS. 15A through 15D, 16A through 16D and 17A through 17C).

Figure 18A:
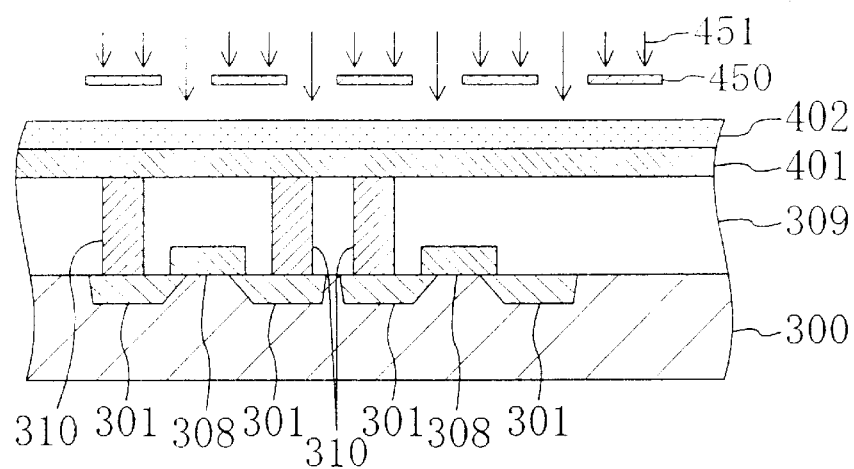
FIGS. 18A, 18B and 18C are cross-sectional views for showing procedures in a method for fabricating a semiconductor device according to Embodiment 4 of the invention.

First, a conducting film 401 and a positive first resist film 402 are successively formed over the first interlayer insulating film 309 as shown in FIG. 18A. Thereafter, the first resist film 402 is irradiated with first exposing light 451 through a first photomask 450. Thus, a portion of the first resist film 402 excluding portions corresponding to interconnect forming regions and dummy interconnect forming regions is exposed.

Figure 18B:
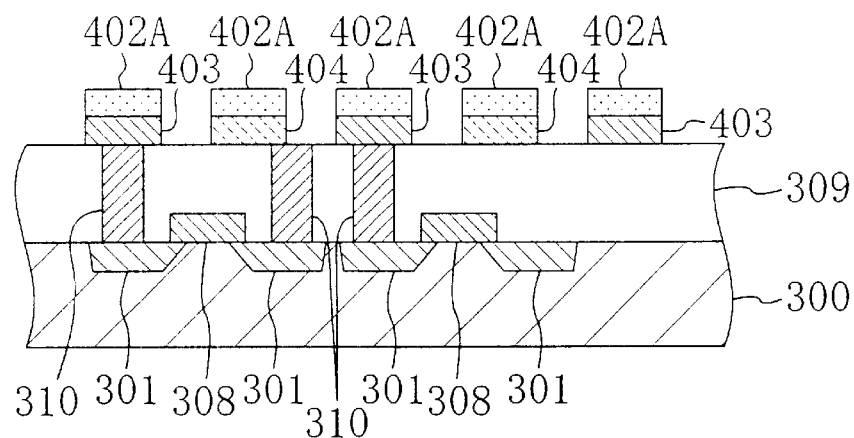

Next, the first resist film 402 is developed, thereby forming a first resist pattern 402A covering the interconnect forming regions and the dummy interconnect forming regions as shown in FIG. 18B. Thereafter, the conducting film 401 is dry etched by using the first resist pattern 402A as a mask, thereby selectively forming virtual interconnects 403 and dummy interconnects 404. At this point, although not shown in the drawing, the virtual interconnects 403 are densely disposed in a first region on the semiconductor substrate 300 while they are sparsely disposed in a second region on the semiconductor substrate 300. Also, the dummy interconnects 404 are formed in the region on the semiconductor substrate 300 where the virtual interconnects 403 are sparsely disposed (namely, in the second region). Furthermore, the virtual interconnects 403 are formed to be connected to the first-layer contact plugs 310. The dummy interconnect 404 may be formed on the first-layer contact plug 310.

Figure 18C:
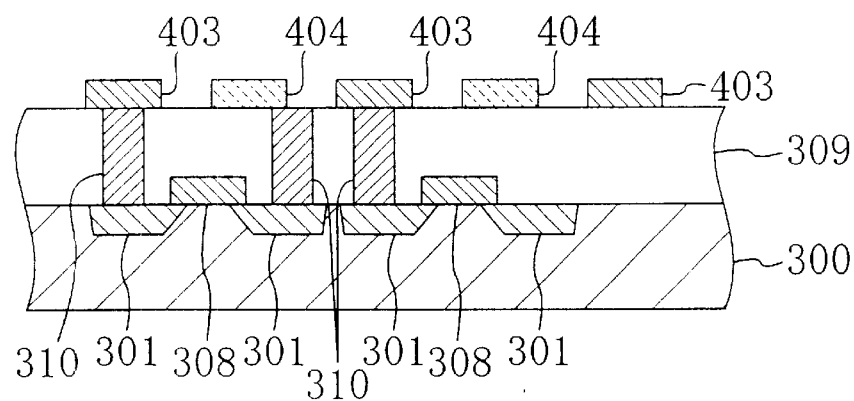
Figure 19A:
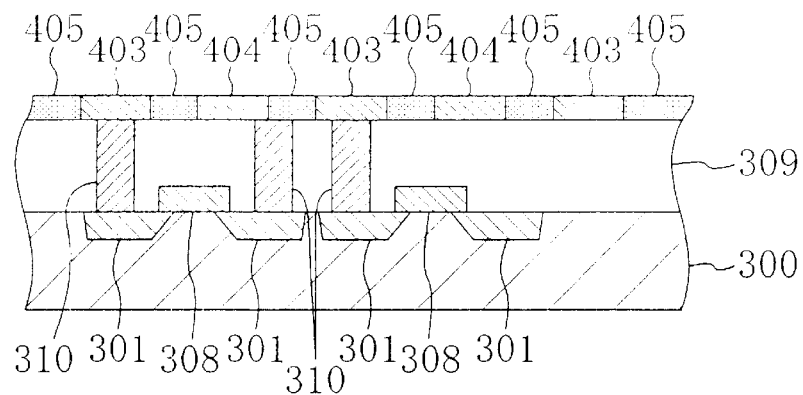
FIGS. 19A, 19B and 19C are cross-sectional views for showing other procedures in the method for fabricating a semiconductor device of Embodiment 4.

Next, after removing the first resist pattern 402A as shown in FIG. 18C, a second resist film 405 (corresponding to a first resist film of claim 13) is formed in a region on the first interlayer insulating film 309 (including portions on the first-layer contact plugs 310) where none of the virtual interconnects 403 and the dummy interconnects 404 is disposed as shown in FIG. 19A.

Figure 19B:
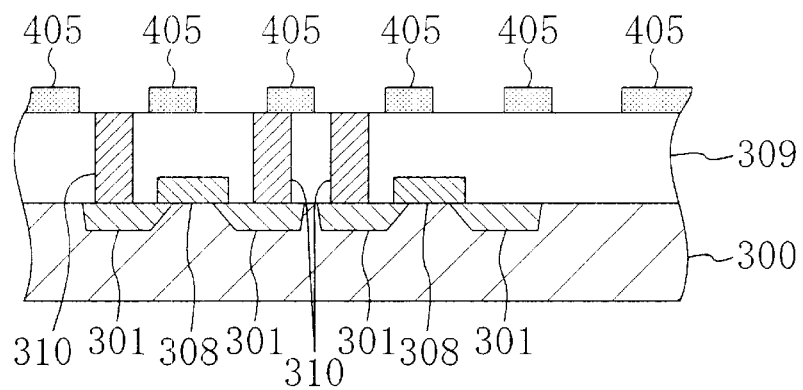
Figure 19C:
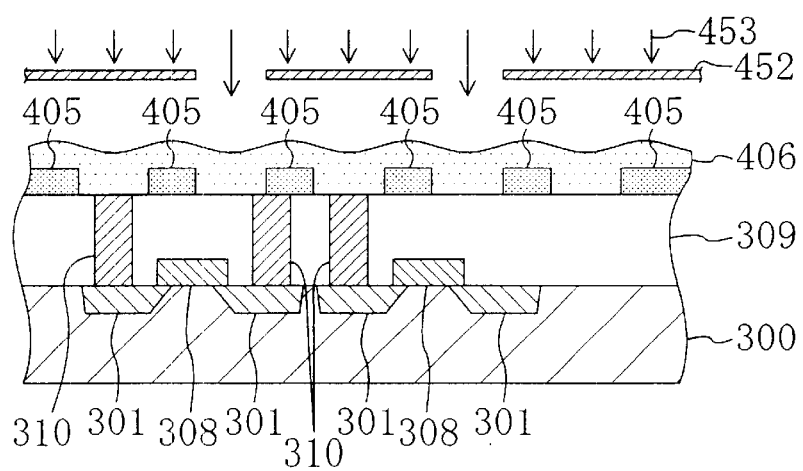

Then, after removing the virtual interconnects 403 and the dummy interconnects 404 as shown in FIG. 19B, a negative third resist film 406 is formed over the first interlayer insulating film 309 as shown in FIG. 19C. Thereafter, the third resist film 406 is irradiated with second exposing light 453 through a second photomask 452. Thus, portions of the third resist film 406 corresponding to regions where the dummy interconnects 404 have been disposed are exposed.

Figure 20A:
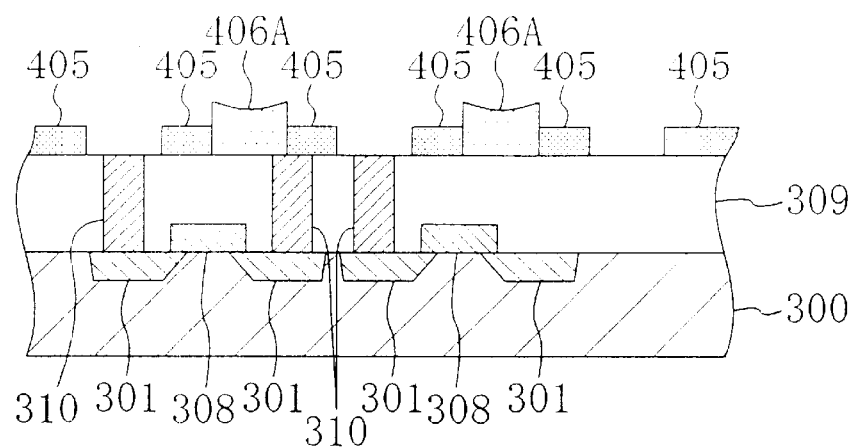
FIGS. 20A and 20B are cross-sectional views for showing still other procedures in the method for fabricating a semiconductor device of Embodiment 4.

Subsequently, the third resist film 406 is developed, thereby forming a second resist pattern 406A (corresponding to a second resist film of claim 13) in recesses from which the dummy interconnects 404 have been removed as shown in FIG. 20A. In other words, the third resist film 406 is allowed to remain merely in the recesses from which the dummy interconnects 404 have been removed.

Figure 20B:
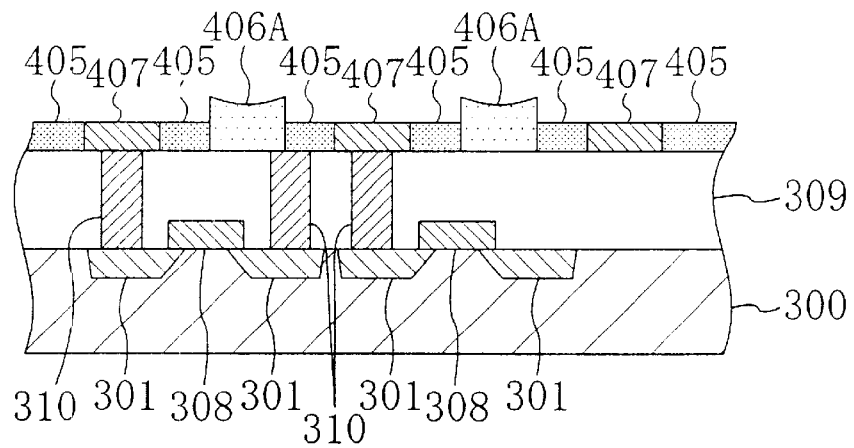
Figure 21A:
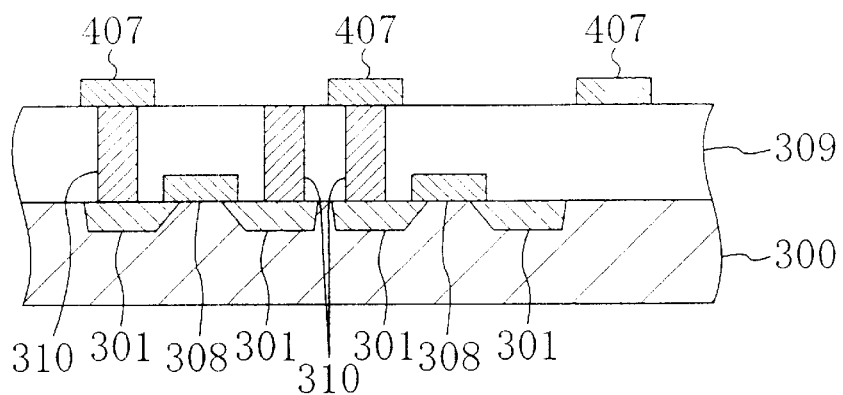
FIGS. 21A and 21B are cross-sectional views for showing still other procedures in the method for fabricating a semiconductor device of Embodiment 4.

Next, as shown in FIG. 20B, interconnects 407 are formed in recesses from which the virtual interconnects 403 have been removed. Thereafter, the second resist film 405 and the second resist pattern 406A (namely, the third resist film 406) are removed as shown in FIG. 21A.

Figure 21B:
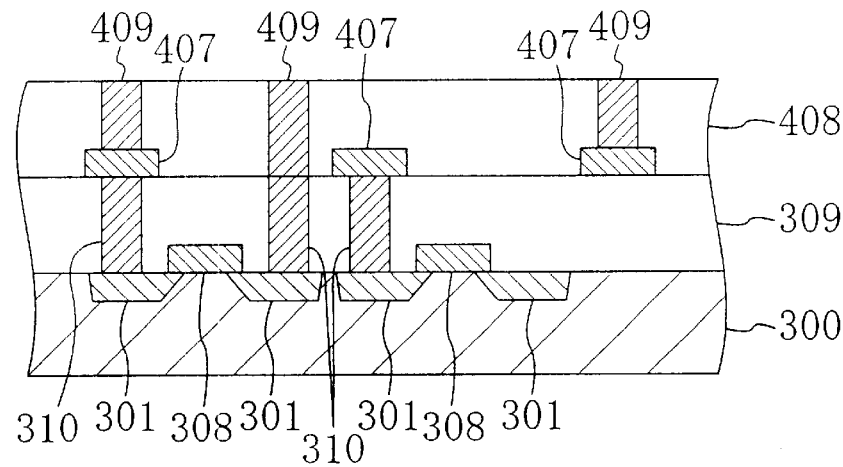

Then, after forming a second interlayer insulating film 408 over the first interlayer insulating film 309 as shown in FIG. 21B, second-layer contact plugs 409 for selectively connecting the interconnects 407 or the first-layer contact plugs 310 to upper layer interconnects (not show) are formed in the second interlayer insulating film 408. At this point, the second-layer contact plug 409 may be formed to overlap with a region where the dummy interconnect 404 has been disposed.

In this manner, according to Embodiment 4, after simultaneously forming the virtual interconnects 403 and the dummy interconnects 404 on the semiconductor substrate 300, the second resist film 405 is formed in the region where none of the virtual interconnects 403 and the dummy interconnects 404 is formed, and then, the virtual interconnects 403 and the dummy interconnects 404 are removed. Thereafter, after forming the second resist pattern 406A in the recesses from which the dummy interconnects 404 have been removed, the interconnects 407 are formed in the recesses from which the virtual interconnects 403 have been removed. Therefore, with the accuracy in forming the virtual interconnects 403, namely, the accuracy in forming the interconnects 407, improved by using the dummy interconnects 404, the region where the dummy interconnect 404 has been disposed can be used as, for example, a region for forming the second-layer contact plug 409 for connecting the first-layer contact plug 310 to the upper layer interconnect. Accordingly, the increase of the circuit area derived from the use of the dummy interconnects 404 can be prevented, namely, the circuit area can be as small as that obtained without using the dummy interconnects 404. As a result, a semiconductor device having a high degree of integration and high performance can be realized.

Although the region where the dummy interconnect 404 has been disposed is used as the region for forming the second-layer contact plug 409 in Embodiment 4, the region where the dummy interconnect 404 has been disposed may be used as a region for forming another composing element such as a capacitor, a diode or a resistance instead.

In Embodiment 4, there is no need to remove the dummy interconnect if it does not affect the circuit area.

Modification of Embodiment 4

A method for fabricating a semiconductor device according to a modification of Embodiment 4 will now be described with reference to the accompanying drawings.

FIGS. 22A through 22C, 23A through 23C, 24A through 24C, 25A and 25B are cross-sectional views for showing procedures in the method for fabricating a semiconductor device of the modification of Embodiment 4.

As a premise of the fabrication method of the modification of Embodiment 4, gate electrodes 308 are formed on a semiconductor substrate 300 having a plurality of pairs of impurity diffusion layers 301 serving as the source or drain regions and selectively formed in surface portions thereof and a first interlayer insulating film 309 provided with first-layer contact plugs 310 connected to the impurity diffusion layers 301 is formed on the semiconductor substrate 300 and the gate electrodes 308 previously through the procedures of the fabrication method of, for example, Embodiment 3 or the modification of Embodiment 3 (specifically, through the procedures of FIGS. 12A through 12D, 13A through 13D, 14A and 14B or the procedures of FIGS. 15A through 15D, 16A through 16D and 17A through 17C).

Figure 22A:
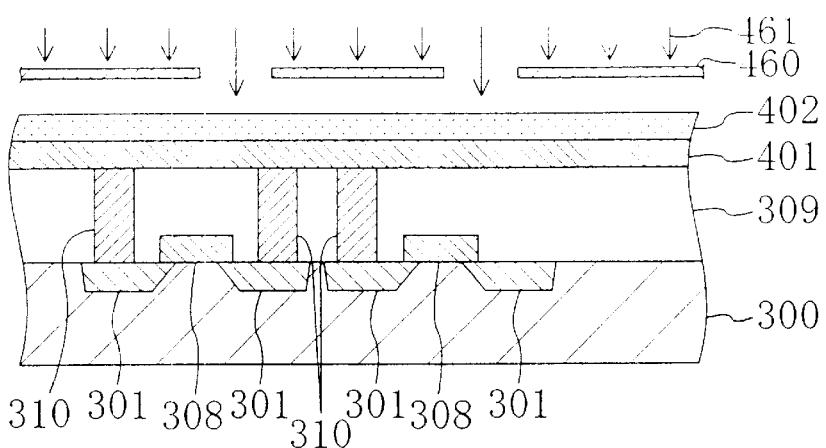
FIGS. 22A, 22B and 22C are cross-sectional views for showing procedures in a method for fabricating a semiconductor device according to a modification of Embodiment 4 of the invention.

First, as shown in FIG. 22A, a conducting film 401 and a negative first resist film 402 are successively formed over the first interlayer insulating film 309. Thereafter, the first resist film 402 is irradiated with first exposing light 461 through a first photomask 460. Thus, portions of the first resist film 402 corresponding to dummy interconnect forming regions are exposed.

Figure 22B:
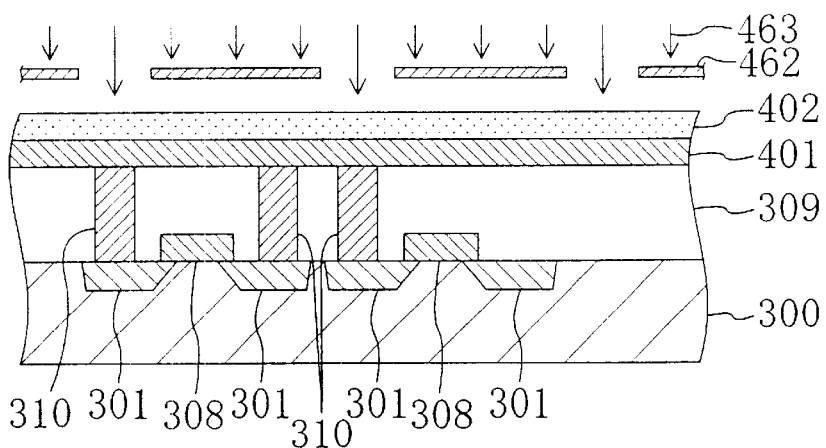

Next, as shown in FIG. 22B, the first resist film 402 is irradiated with second exposing light 463 through a second photomask 462. Thus, portions of the first resist film 402 corresponding to interconnect forming regions are exposed.

Figure 22C:
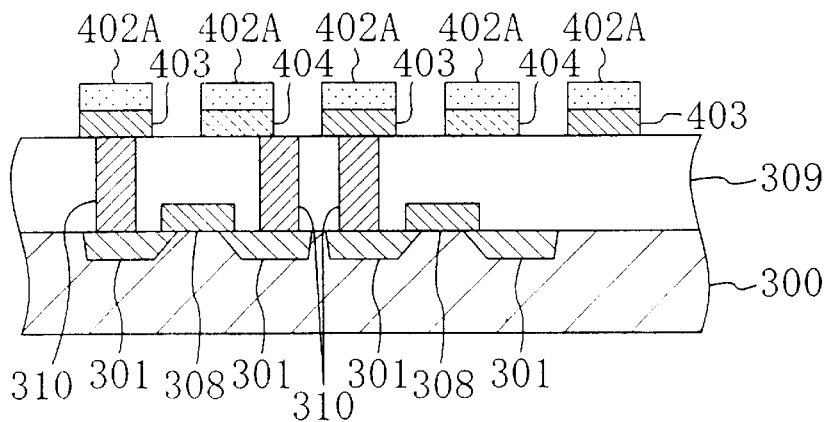

Then, the first resist film 402 is developed, thereby forming a first resist pattern 402A covering the interconnect forming regions and the dummy interconnect forming regions as shown in FIG. 22C. Thereafter, the conducting film 401 is dry etched by using the first resist pattern 402A as a mask, thereby selectively forming virtual interconnects 403 and dummy interconnects 404. At this point, although not shown in the drawing, the virtual interconnects 403 are densely disposed in a first region on the semiconductor substrate 300 while they are sparsely disposed in a second region on the semiconductor substrate 300. Also, the dummy interconnects 404 are formed in the region on the semiconductor substrate 300 where the virtual interconnects 403 are sparsely disposed (namely, in the second region). Furthermore, the virtual interconnects 403 are formed to be connected to the firstlayer contact plugs 310. The dummy interconnect 404 may be formed on the first-layer contact plug 310.

Figure 23A:
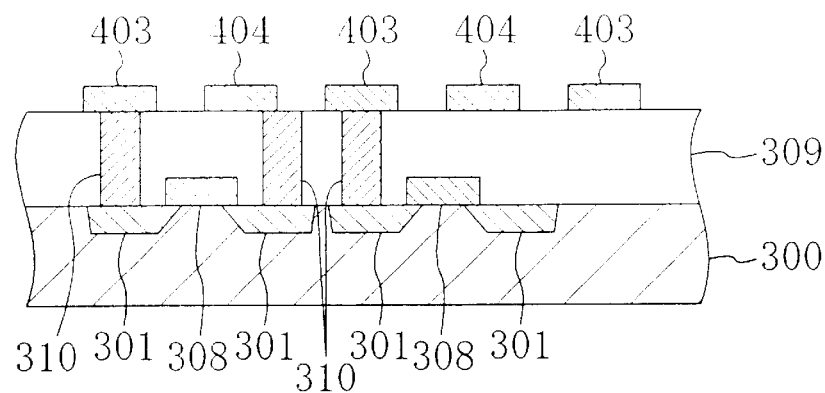
FIGS. 23A, 23B and 23C are cross-sectional views for showing other procedures in the method for fabricating a semiconductor device of the modification of Embodiment 4.
Figure 23B:
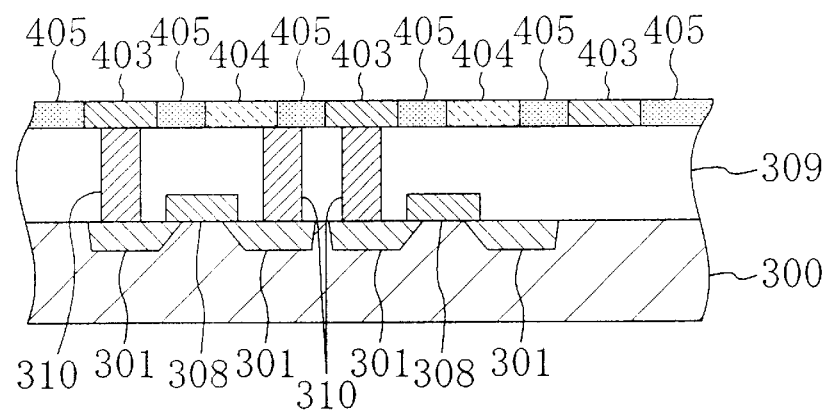

Next, after removing the first resist pattern 402A as shown in FIG. 23A, a second resist film 405 (corresponding to a first resist film of claim 13) is formed in a region on the first interlayer insulating film 309 (including portions on the first-layer contact plugs 310) where none of the virtual interconnects 403 and the dummy interconnects 404 is disposed as shown in FIG. 23B.

Figure 23C:
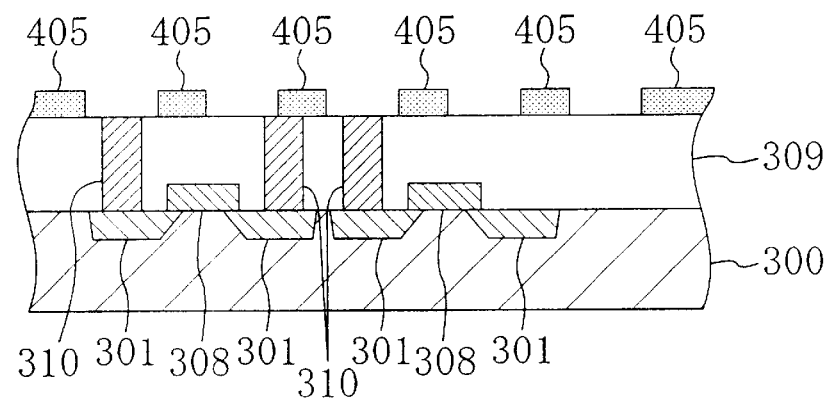
Figure 24A:
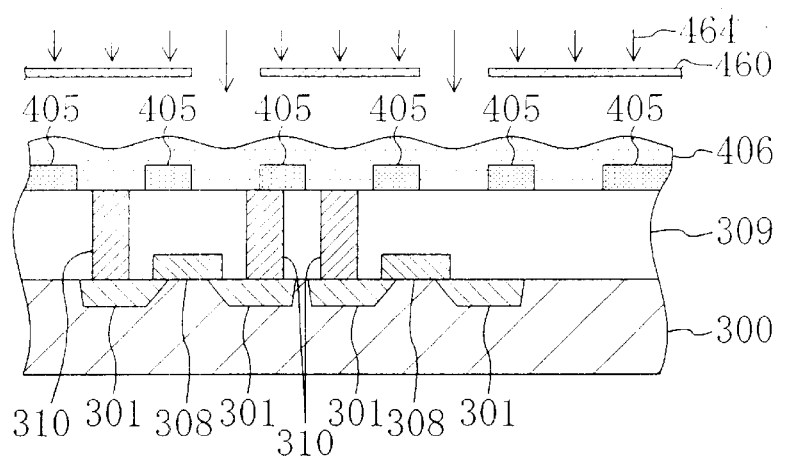
FIGS. 24A, 24B and 24C are cross-sectional views for showing still other procedures in the method for fabricating a semiconductor device of the modification of Embodiment 4.

Then, after removing the virtual interconnects 403 and the dummy interconnects 404 as shown in FIG. 23C, a negative third resist film 406 is formed over the first interlayer insulating film 309 as shown in FIG. 24A. Thereafter, the third resist film 406 is irradiated with third exposing light 464 through the first photomask 460 that is used in the procedure of FIG. 22A for exposing the portions of the first resist film 402 corresponding to the dummy interconnect forming regions. Thus, portions of the third resist film 406 corresponding to the regions where the dummy interconnects 404 have been disposed are exposed.

Figure 24B:
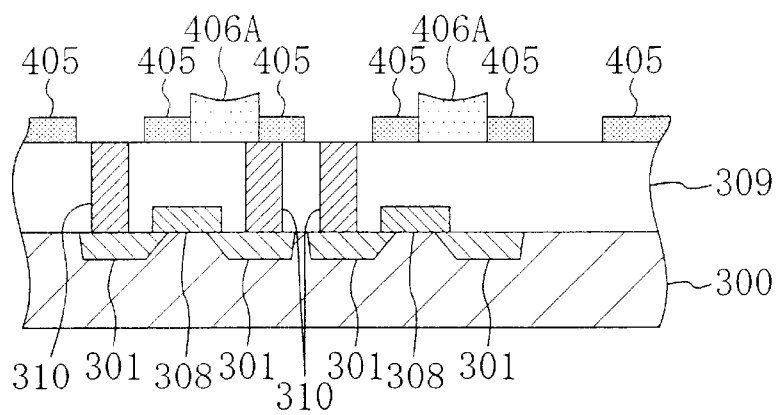

Subsequently, the third resist film 406 is developed, thereby forming a second resist pattern 406A (corresponding to a second resist film of claim 13) in recesses from which the dummy interconnects 404 have been removed as shown in FIG. 24B. In other words, the third resist film 406 is allowed to remain merely in the recesses from which the dummy interconnects 404 have been removed.

Figure 24C:
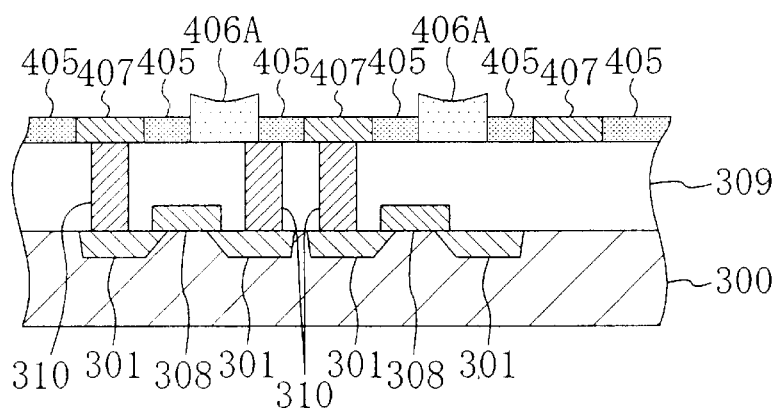
Figure 25A:
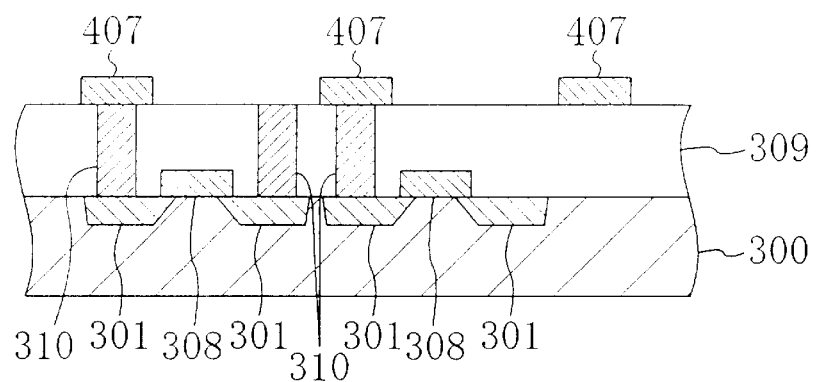
FIGS. 25A and 25B are cross-sectional views for showing still other procedures in the method for fabricating a semiconductor device of the modification of Embodiment 4.

Next, after forming interconnects 407 in recesses from which the virtual interconnects 403 have been removed as shown in FIG. 24C, the second resist film 405 and the second resist pattern 406A (namely, the third resist film 406) are removed as shown in FIG. 25A.

Figure 25B:
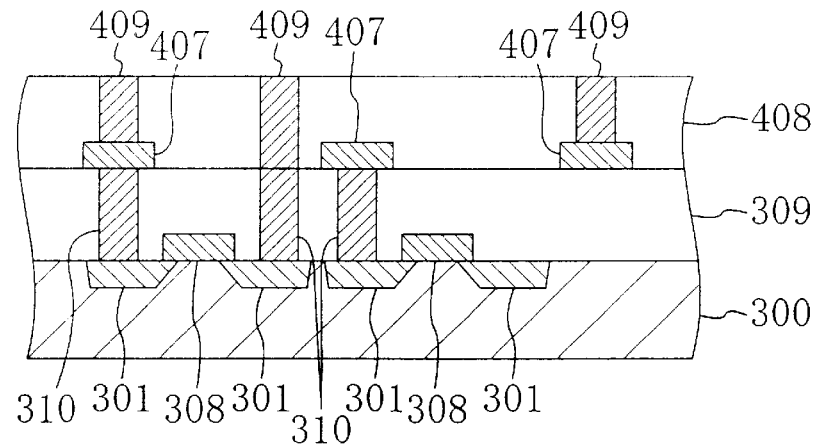
Figure 26A:
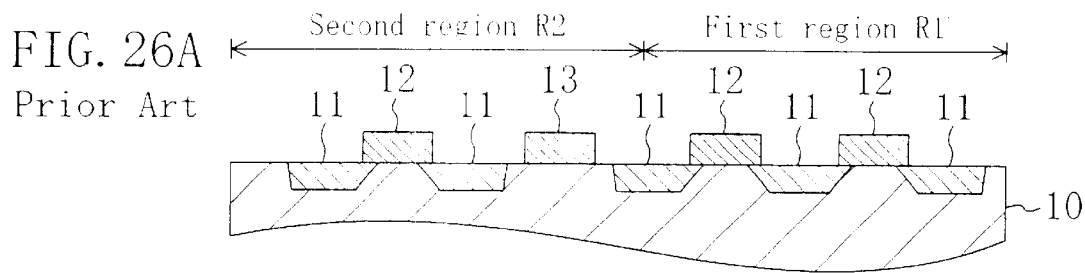
FIGS. 26A, 26B, 26C and 26D are cross-sectional views for showing procedures in a conventional method for fabricating a semiconductor device.
Figure 26B:
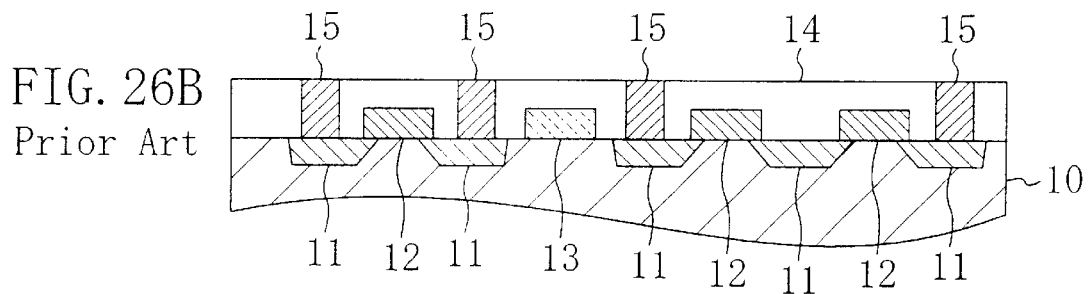
Figure 26C:
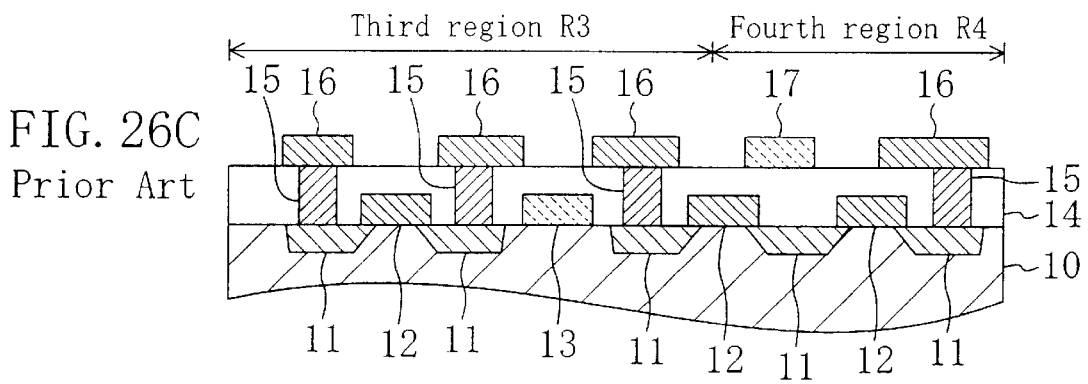
Figure 26D:
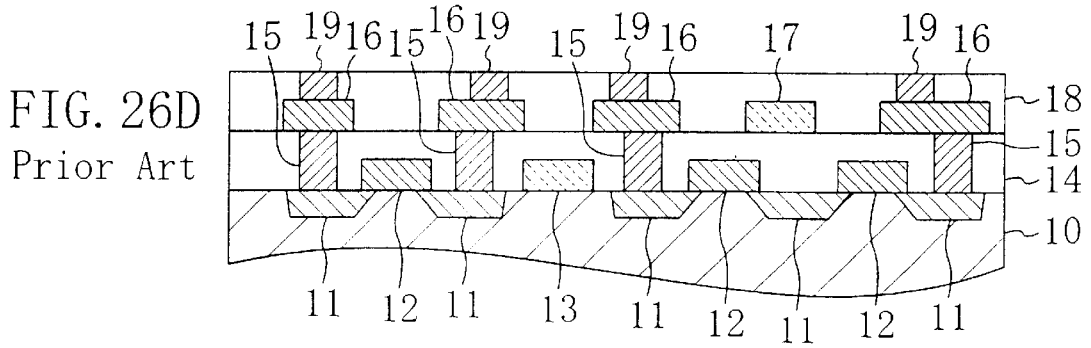

Then, after forming a second interlayer insulating film 408 over the first interlayer insulating film 309 as shown in FIG. 25B, second-layer contact plugs 409 for selectively connecting the interconnects 407 or the first-layer contact plugs 310 to upper layer interconnects (not shown) are formed in the second interlayer insulating film 408. At this point, the second-layer contact plug 409 may be formed to overlap with a region where the dummy interconnect 404 has been disposed.

In this manner, according to the modification of Embodiment 4, not only the effect of Embodiment 4 but also the following effect can be attained: Since the first photomask 460 used for forming the dummy interconnects 404 is used in forming the second resist pattern 406A in the recesses from which the dummy interconnects 404 have been removed, the second resist pattern 406A can be accurately formed, resulting in improving the reliability of the semiconductor device.

Although the region where the dummy interconnect 404 has been disposed is used as the region for forming the second-layer contact plug 409 in the modification of Embodiment 4, the region where the dummy interconnect 404 has been disposed may be used as a region for forming another composing element such as a capacitor, a diode or a resistance instead.

In the modification of Embodiment 4, after exposing the portions of the first resist film 402 corresponding to the dummy interconnect forming regions by using the first photomask 460 (in the procedure of FIG. 22A), the portions of the first resist film 402 corresponding to the interconnect forming regions are exposed by using the second photomask 462 (in the procedure of FIG. 22B). Instead, after exposing the portions of the first resist film 402 corresponding to the interconnect forming regions by using the second photomask 462, the portions of the first resist film 402 corresponding to the dummy interconnect forming regions may be exposed by using the first photomask 460.

In the modification of Embodiment 4, there is no need to remove the dummy gate electrode if it does not affect the circuit area.

What is claimed is:

1. A method for fabricating a semiconductor device comprising the steps of:
   simultaneously forming a gate electrode and a dummy gate electrode on a semiconductor substrate;
   removing said dummy gate electrode;
   forming an interlayer insulating film on said semiconductor substrate after removing said dummy gate electrode; and
   forming, in said interlayer insulating film, a plug in a region overlapping with at least a part of a region where said dummy gate electrode has been disposed.

2. The method for fabricating a semiconductor device of claim 1,
   wherein a photomask used for forming said dummy gate electrode is used in removing said dummy gate electrode.

3. A method for fabricating a semiconductor device comprising the steps of:
   forming a pair of impurity diffusion layers serving as source and drain regions in surface portions of a semiconductor substrate;
   simultaneously forming a gate electrode on said semiconductor substrate between said pair of impurity diffusion layers and a dummy gate electrode on at least one of said pair of impurity diffusion layers; and
   removing said dummy gate electrode.

4. The method for fabricating a semiconductor device of claim 3,
   wherein a photomask used for forming said dummy gate electrode is used in removing said dummy gate electrode.

5. The method for fabricating a semiconductor device of claim 3, further comprising, after the step of removing said dummy gate electrode, the steps of:
   forming an interlayer insulating film on said semiconductor substrate; and
   forming, in said interlayer insulating film, a plug in a region overlapping with at least a part of a region where said dummy gate electrode has been disposed.

6. A method for fabricating a semiconductor device comprising the steps of:
   simultaneously forming an interconnect and a dummy interconnect on a semiconductor substrate;
   removing said dummy interconnect;
   forming an interlayer insulating film on said semiconductor substrate after removing said dummy interconnect; and
   forming, in said interlayer insulating film, a plug in a region overlapping with at least a part of a region where said dummy interconnect has been disposed.

7. The method for fabricating a semiconductor device of claim 6,
   wherein a photomask used for forming said dummy interconnect is used in removing said dummy interconnect.

8. A method for fabricating a semiconductor device comprising the steps of:
   forming, on a semiconductor substrate, an interlayer insulating film provided with a plug;
   simultaneously forming an interconnect on said interlayer insulating film and a dummy interconnect on said plug; and
   removing said dummy interconnect.

9. The method for fabricating a semiconductor device of claim 8,
   wherein a photomask used for forming said dummy interconnect is used in removing said dummy interconnect.

10. The method for fabricating a semiconductor device of claim 8, further comprising, after the step of removing said dummy interconnect, the steps of:
    forming a second interlayer insulating film on said interlayer insulating film; and
    forming, in said second interlayer insulating film, a second plug in a region overlapping with at least a part of a region where said dummy interconnect has been disposed.

11. A method for fabricating a semiconductor device comprising the steps of:
    simultaneously forming a virtual gate electrode and a dummy gate electrode on a semiconductor substrate;
    forming a first resist film on said semiconductor substrate in a region where none of said virtual gate electrode and said dummy gate electrode is formed;

removing said virtual gate electrode and said dummy gate electrode;

forming a second resist film in a recess from which said dummy gate electrode has been removed; and forming a gate electrode in a recess from which said virtual gate electrode has been removed.

12. The method for fabricating a semiconductor device of claim 11, wherein a photomask used for forming said dummy gate electrode is used in forming said second resist film.

13. A method for fabricating a semiconductor device comprising the steps of:

simultaneously forming a virtual interconnect and a dummy interconnect on a semiconductor substrate;

forming a first resist film on said semiconductor substrate in a region where none of said virtual interconnect and said dummy interconnect is formed;

removing said virtual interconnect and said dummy interconnect;

forming a second resist film in a recess from which said dummy interconnect has been removed; and forming an interconnect in a recess from which said virtual interconnect has been removed.

14. The method for fabricating a semiconductor device of claim 13, wherein a photomask used for forming said dummy interconnect is used in forming said second resist film.

* * * * *